(12) United States Patent
Kamijo et al.

(10) Patent No.: US 9,331,263 B2
(45) Date of Patent: *May 3, 2016

(54) PIEZOELECTRIC MOTOR, DRIVE UNIT, ELECTRONIC PART TRANSFER APPARATUS, ELECTRONIC PART INSPECTION APPARATUS, ROBOT, AND PRINTER

(71) Applicant: Seiko Epson Corporation, Tokyo (JP)

(72) Inventors: Koichi Kamijo, Matsumoto (JP); Kazuhiro Tsuchiya, Azumino (JP)

(73) Assignee: Seiko Epson Corporation (JP)

( * ) Notice: Subject to any disclaimer, the term of this patent is extended or adjusted under 35 U.S.C. 154(b) by 440 days.

This patent is subject to a terminal disclaimer.

(21) Appl. No.: 13/693,421

(22) Filed: Dec. 4, 2012

(65) Prior Publication Data

US 2013/0140952 A1 Jun. 6, 2013

(30) Foreign Application Priority Data

Dec. 6, 2011 (JP) ................................. 2011-266547

(51) Int. Cl.
| | |
|---|---|
| *H01L 41/09* | (2006.01) |
| *H01L 41/04* | (2006.01) |
| *H02N 2/00* | (2006.01) |
| *H02N 2/10* | (2006.01) |
| *H02N 2/12* | (2006.01) |
| *B25J 15/00* | (2006.01) |
| *H02N 2/16* | (2006.01) |

(52) U.S. Cl.
CPC .............. *H01L 41/09* (2013.01); *B25J 15/0009* (2013.01); *H01L 41/04* (2013.01); *H02N 2/004* (2013.01); *H02N 2/007* (2013.01); *H02N 2/0095* (2013.01); *H02N 2/103* (2013.01); *H02N 2/126* (2013.01); *H02N 2/163* (2013.01)

(58) Field of Classification Search
CPC ..... H02N 2/004; H02N 2/007; H02N 2/0095; H02N 2/103; H02N 2/126; H02N 2/163; B25J 15/0009
USPC ............... 310/323.02, 323.16, 328, 311, 330, 310/331, 326, 313 R, 348
See application file for complete search history.

(56) References Cited

U.S. PATENT DOCUMENTS

| | | | |
|---|---|---|---|
| 4,736,129 A | 4/1988 | Endo et al. | |
| 5,594,291 A | 1/1997 | Tamai et al. | |
| 7,378,777 B2 * | 5/2008 | Moteki et al. | 310/323.16 |
| 7,911,112 B2 | 3/2011 | Adachi et al. | |
| 2004/0027032 A1 * | 2/2004 | Moteki et al. | 310/323.02 |
| 2006/0226737 A1 * | 10/2006 | Miyazawa et al. | 310/323.02 |

(Continued)

FOREIGN PATENT DOCUMENTS

| | | |
|---|---|---|
| CN | 101329362 A | 12/2008 |
| JP | 59-188381 A | 10/1984 |

(Continued)

*Primary Examiner* — Thomas Dougherty
*Assistant Examiner* — Karen B Addison
(74) *Attorney, Agent, or Firm* — Harness, Dickey & Pierce, P.L.C.

(57) ABSTRACT

A piezoelectric motor includes a piezoelectric element, an oscillating plate including the piezoelectric element, a driving projection provided at an end of the oscillating plate, and a driven member driven by the driving projection coming into abutment therewith and is characterized in that Young's modulus E1 of the driving projection and Young's modulus E2 of the driven member are different.

10 Claims, 15 Drawing Sheets

(56) References Cited

U.S. PATENT DOCUMENTS

| | | | |
|---|---|---|---|
| 2007/0188050 A1* | 8/2007 | Hashimoto | 310/323.02 |
| 2008/0207390 A1 | 8/2008 | Tochimoto et al. | |
| 2008/0317575 A1 | 12/2008 | Yamazaki et al. | |
| 2009/0278421 A1 | 11/2009 | Hamamoto et al. | |
| 2012/0034052 A1 | 2/2012 | Yamazaki et al. | |

FOREIGN PATENT DOCUMENTS

| | | |
|---|---|---|
| JP | 61-277382 | 12/1986 |
| JP | 05-252767 | 9/1993 |
| JP | 06-038555 A | 2/1994 |
| JP | 11-136968 | 5/1999 |
| JP | 2001-032060 A | 2/2001 |
| JP | 2001-286167 A | 10/2001 |
| JP | 2003-159566 A | 6/2003 |
| JP | 2004-159403 A | 6/2004 |
| JP | 2004-236493 | 8/2004 |
| JP | 2005-073341 A | 3/2005 |
| JP | 2005-086991 A | 3/2005 |
| JP | 2005-304147 | 10/2005 |
| JP | 2007-306799 | 11/2007 |
| JP | 2008-245507 A | 10/2008 |
| JP | 2010-233332 A | 10/2010 |
| JP | 2010-233335 A | 10/2010 |

* cited by examiner

PIEZOELECTRIC MOTOR, DRIVE UNIT, ELECTRONIC PART TRANSFER APPARATUS, ELECTRONIC PART INSPECTION APPARATUS, ROBOT, AND PRINTER

BACKGROUND

1. Technical Field

The present invention relates to a piezoelectric motor which utilizes the oscillation of a piezoelectric body, a drive unit provided with a mechanism of the piezoelectric motor, an electronic part transfer apparatus, an electronic part inspection apparatus, a robot, and a printer.

2. Related Art

In the related art, an ultrasonic motor on which a piezoelectric actuator having a piezoelectric ceramics board and a pressing member is mounted as described in JP-A-2004-236493 is disclosed as a piezoelectric motor. The ultrasonic motor has a configuration in which the pressing member performs an oval motion by the oscillation of the piezoelectric ceramics board. The ultrasonic motor is configured to move a movable member (stage) in abutment with the pressing member along a guide rail by the oval motion of the pressing member. In this case, hardness H1 of an abutting portion of the pressing member and hardness H2 of an abutting portion of the movable member are preferably set to H1/H2=0.75 to 1.5, whereby abrasion at the abutting portions may effectively be restrained.

JP-A-2007-306799 discloses an ultrasonic actuator (piezoelectric motor) having a piezoelectric element and a driver configured to perform an oval motion by the oscillation of the piezoelectric element. The ultrasonic actuator has a configuration in which the abutting portion between the driver and the movable member is minimized in a relationship between the driver and the movable member which is driven by abutment with the driver, whereby the efficient driving of the movable member is enabled. In this configuration, when the driver and the movable member are formed of alumina, the alumina for the movable member having a hardness lower than that of the alumina for the driver is considered to be preferable.

However, the hardness of the pressing member and the movable member described in JP-A-2004-236493 is so-called plastic deformation hardness, and is expressed by Vickers hardness. In JP-A-2007-306799 as well, setting relating to the hardness of the driver and the movable member is performed although the term "plastic deformation hardness (Vickers hardness)" is not set forth. Here, in the piezoelectric motor such as the ultrasonic motor, there is a case where the abrasion caused by a sliding motion may not be restrained effectively only by the setting on the basis of the plastic deformation hardness, and the mechanism of abrasion in the piezoelectric motor is being clarified not to be affected only by the plastic deformation hardness. Therefore, there is a problem that effective restraint of the abrasion caused by the sliding motion is difficult only by setting the hardness on the basis of the plastic deformation hardness as described in JP-A-2004-236493 and JP-A-2007-306799.

SUMMARY

An advantage of some aspects of the invention is to solve at least apart of the problems described above, and the invention can be implemented as the following application examples or forms.

Application Example 1

This application example is directed to a piezoelectric motor including a piezoelectric element, an oscillating portion including the piezoelectric element, a driving projection provided at an end of the oscillating portion, and a driven member driven by the driving projection coming into abutment therewith and is characterized in that Young's modulus E1 of the driving projection and Young's modulus E2 of the driven member have a relationship of $E1 \neq E2$.

According to the piezoelectric motor of this application example, the values of the Young's moduli of the driving projection and the driven member which come into abutment and slide with each other are differentiated. The material having a large value of Young's modulus tends to have large value of plastic deformation hardness (Vickers hardness) as well, but these values are not necessarily proportional. Therefore, for example, even two of the driven members are formed of materials having almost the same plastic deformation hardness, the driven member formed of a material having a high Young's modulus is subject to smaller amount of indentation on the surface of the material due to the abutment with the driving projection in comparison with the driven member formed of a material having a low Young's modulus. When the driving projection was brought into abutment with and slid with respect to the driven member, it was found that the driven member formed of the material having a higher Young's modulus was subject to less indentation and hence was subject to less abrasion caused by a sliding motion, and hence was superior in abrasion resistance. In this manner, in the relationship between the driving projection and the driven member of the piezoelectric motor, the Young's modulus in the vicinity of the surface portions thereof which come into abutment and slide with each other affects on the abrasion resistance. In addition, it was found that silicon nitride, for example, is inferior in abrasion resistance in comparison with aluminum oxide if the Young's modulus of the outermost surface thereof is lower than that of the aluminum oxide even though the plastic deformation hardness thereof is higher than that of aluminum oxide. The Young's modulus in this case is a value within a minute range in the vicinity of the surface portion which cannot be measured accurately by measurement of Vickers hardness, which is plastic deformation hardness. In the light of such situation, the piezoelectric motor is characterized by having the relationship between the Young's modulus E1 of the driving projection and the Young's modulus E2 of the driven member of $E1 \neq E2$ in addition to the plastic deformation of the related art as a relationship between the driving projection and the driven member. The piezoelectric motor having the characteristic as described above allows improvement of the abrasion resistance of the driving projection and the driven member and, simultaneously, easy setting or the like which causes one of the driving projection and the driven member to be abraded is enabled. Accordingly, the piezoelectric motor may include the driving projection and the driven member having optimal abrasion resistance in accordance with the required function.

Application Example 2

In the piezoelectric motor of the application example described above, it is preferable that the Young's modulus E1 of the driving projection and the Young's modulus E2 of the driven member have a relationship of $E1 < E2$.

In this configuration, by the setting of Young's modulus E1 of the driving projection<Young's modulus E2 of the driven member, the piezoelectric motor has a configuration in which the driven member is insusceptible to abrasion in comparison with the driving projection. Accordingly, the piezoelectric motor has a configuration in which the abraded driving projection is replaced after a long term of usage, so that the maintenance or the like is facilitated, and hence application to various apparatuses is preferably achieved.

Application Example 3

In the piezoelectric motor of the application example described above, it is preferable that the Young's modulus E1 of the driving projection and the Young's modulus E2 of the driven member have a relationship of E1>E2.

In this configuration, by the setting of Young's modulus E1 of the driving projection>Young's modulus E2 of the driven member, the piezoelectric motor has a configuration in which the driving projection is insusceptible to abrasion in comparison with the driven member. Accordingly, the piezoelectric motor has a configuration in which the abraded driven member is replaced after the long term of usage, so that the maintenance or the like is facilitated, and hence application to various apparatuses is preferably achieved.

Application Example 4

In the piezoelectric motor of the application example described above, it is preferable that the driving projection and the driven member are formed of the same material.

In this configuration, the driving projection and the driven member of the piezoelectric motor are formed of the same material, and when they are formed of the same material, Young's modulus may easily be differentiated by processing or the like. For example, when the driving projection and the driven member are formed of ceramics, the driving projection and the driven member formed of ceramics different in Young's modulus may be obtained by changing the sintering temperature with the same treating furnace and treating atmosphere.

Application Example 5

In the piezoelectric motor of the application example described above, it is preferable that the driving projection and the driven member are formed of different materials.

In this configuration, if the driving projection and the driven member of the piezoelectric motor are formed of different materials, and if they are formed of the different materials, a wide range of materials different in Young's modulus may be selected corresponding to the function required for the piezoelectric motor. Accordingly, the driving projection and the driven member having various and a wide range of characteristics formed of materials different not only in material composition but also in Young's modulus are obtained.

Application Example 6

In the piezoelectric motor of the application example described above, it is preferable that the driving projection and the driven member includes magnesium oxide (MgO) and aluminum oxide ($Al_2O_3$), and at least areas from the surface portions thereof coming into abutment with each other to a depth of 200 nm have the Young's modulus E1 or the Young's modulus E2.

In this configuration, the driving projection and the driven member of the piezoelectric motor are formed of aluminum oxide ($Al_2O_3$) having desirable abrasion resistance. In addition, since the aluminum oxide includes magnesium oxide (MgO), and may be increased in Young's modulus than the case where magnesium oxide (MgO) is not included, and adjustment of the Young's modulus at that content percentage is also possible. In this case, the Young's modulus indicates a value in the area from the surface portion of the aluminum oxide to a depth of 200 nm, and this area is a minute depth range which cannot be measured accurately by measurement of Vickers hardness, which is plastic deformation hardness. Accordingly, the driving projection and the driven member are formed of aluminum oxide having optimum abrasion resistances, respectively.

Application Example 7

This application example is directed to a drive unit including a mechanism of the piezoelectric motor described in the application example described above.

According to the drive unit of this application example, the mechanism of the piezoelectric motor or the mechanism equivalent to the piezoelectric motor, that is, the piezoelectric element, the oscillating portion having the piezoelectric elements laminated one on top of another, the driving projection provided at the end of the oscillating portion, and the driven member driven by abutment with the driving projection are provided. In this drive unit, the driving projection and the driven member which is driven to rotate or driven to make a linear motion by the driving projection have different Young's moduli, so that the abrasion caused by the sliding motion with respect to each other may effectively be restrained.

Application Example 8

This application example is directed to an electronic part transfer apparatus including a mechanism of the piezoelectric motor described in the application example described above. According to the electronic part transfer apparatus of this application example, the mechanism of the piezoelectric motor or the mechanism equivalent to the piezoelectric motor, that is, the piezoelectric element, the oscillating portion having the piezoelectric elements laminated one on top of another, the driving projection provided at the end of the oscillating portion, and the driven member driven by abutment with the driving projection are provided. In the electronic part transfer apparatus, the driving projection and the driven member driven by the driving projection and configured to transfer the electronic part to a predetermined position have different Young's moduli, and hence abrasion caused by the sliding motion with respect to each other may effectively be restrained, whereby the maintenance or the like is facilitated and stable transfer may be maintained.

Application Example 9

This application example is directed to an electronic part inspection apparatus including a mechanism of the piezoelectric motor described in the application example described above.

According to the electronic part inspection apparatus of this application example, in order to transfer the electronic part to be inspected, the mechanism of the piezoelectric motor or the mechanism equivalent to the piezoelectric motor, that is, the piezoelectric element, the oscillating portion having the piezoelectric elements laminated one on top of another, the driving projection provided at the end of the oscillating portion, and the driven member driven by abutment with the driving projection are provided. In the electronic part inspection apparatus, the driving projection and the driven member driven by the driving projection and configured to transfer the electronic part to a predetermined position have different Young's moduli, and hence abrasion caused by the sliding motion with respect to each other may effectively be restrained, whereby accurate positioning of the electronic part is achieved, and hence quick and exact inspection is possible.

Application Example 10

This application example is directed to a robot including a mechanism of the piezoelectric motor described in the application example described above.

According to the robot of this application example, the mechanism of the piezoelectric motor or the mechanism equivalent to the piezoelectric motor, that is, the piezoelectric element, the oscillating portion having the piezoelectric elements laminated one on top of another, the driving projection provided at an end of the oscillating portion, and the driven member driven by abutment with the driving projection are provided. The robot is provided for example on the robot hand, includes the driving projection and the driven member having different Young's moduli, and abrasion caused by the sliding motion with respect to each other may effectively be restrained.

Application Example 11

This application example is directed to a printer including a mechanism of the piezoelectric motor described in the application example described above.

According to the printer of this application example, the mechanism of the piezoelectric motor or the mechanism equivalent to the piezoelectric motor, that is, the piezoelectric element, the oscillating portion having the piezoelectric elements laminated one on top of another, the driving projection provided at an end of the oscillating portion, and the driven member driven by abutment with the driving projection are provided. This printer has a configuration in which the driving projection and the driven member driven by the driving projection drive a cutter or the like configured to cut a printed printing medium smoothly, and the driving projection and the driven member have different Young's moduli, and hence the abrasion caused by the sliding movement with respect to each other may effectively be restrained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Referring now to the attached drawings, preferable examples of a piezoelectric motor, a drive unit, an electronic part inspection apparatus, a robot, and a printer according to the invention will be described in sequence.

First Embodiment

Figure 1A:
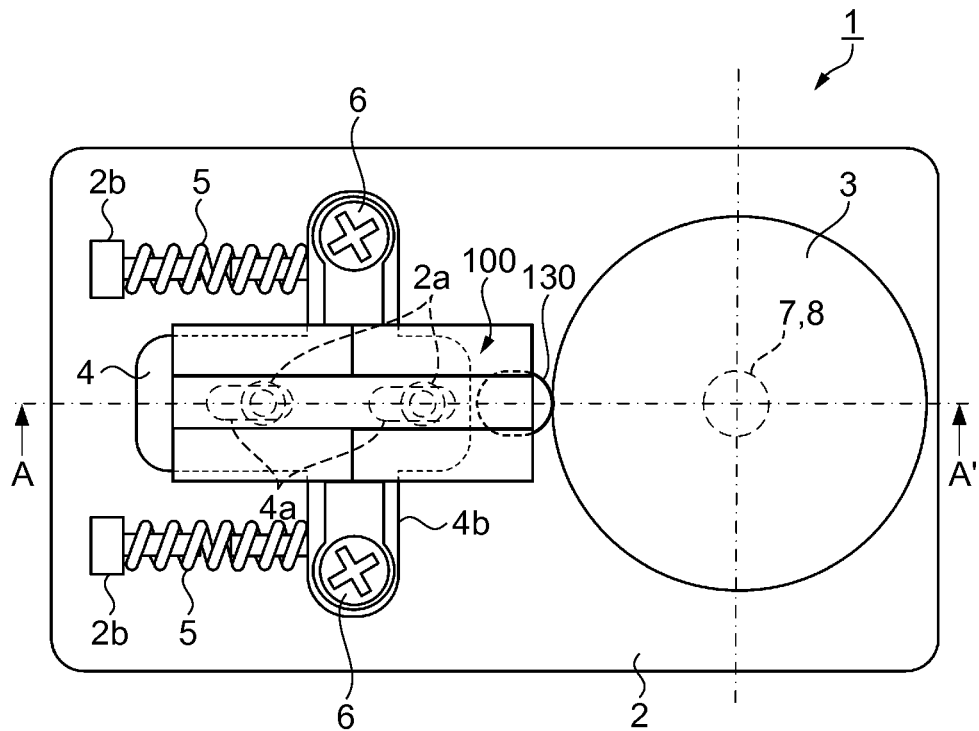
FIG. 1A is a plan view illustrating a piezoelectric motor of a first embodiment.
Figure 1B:
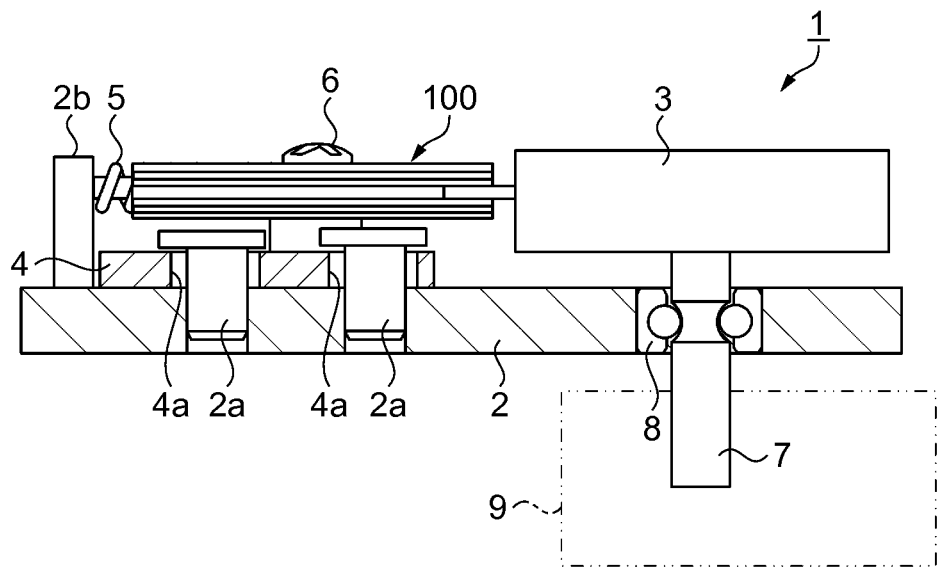
FIG. 1B is a cross-sectional view illustrating the piezoelectric motor.

FIG. 1A is a plan view illustrating the piezoelectric motor of a first embodiment, and FIG. 1B is a cross-sectional view illustrating the piezoelectric motor taken along the line A-A' in FIG. 1A. As illustrated in FIG. 1A, a piezoelectric motors 1 includes a base 2, a driven member 3 rotatably provided on the base 2, a supporting member 4 slidably fixed to the base 2, coil springs 5 configured to urge the supporting member 4 toward the driven member 3, and a piezoelectric actuator 100 fixed to the supporting member 4 with screws 6.

Figure 2A:
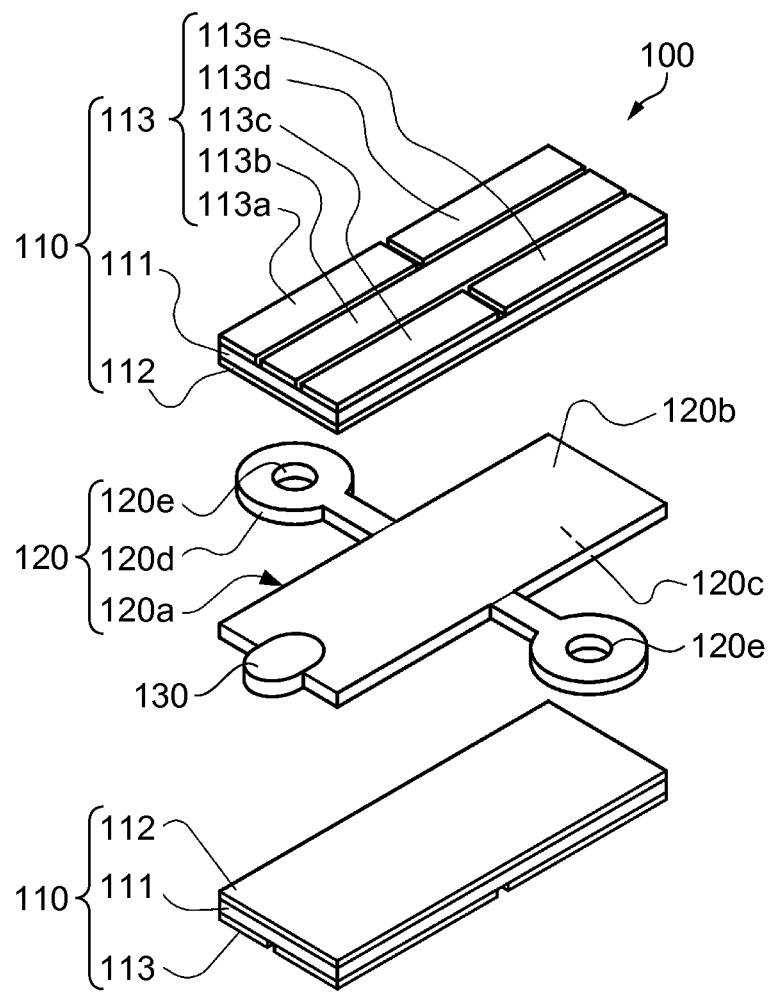
FIG. 2A is a perspective view illustrating a configuration of a piezoelectric actuator.

First of all, the piezoelectric actuator 100 of the piezoelectric motor 1 will be described. FIG. 2A is a perspective view illustrating a configuration of a piezoelectric actuator, and FIG. 2A is a perspective view illustrating an appearance of the piezoelectric actuator.

Figure 2B:
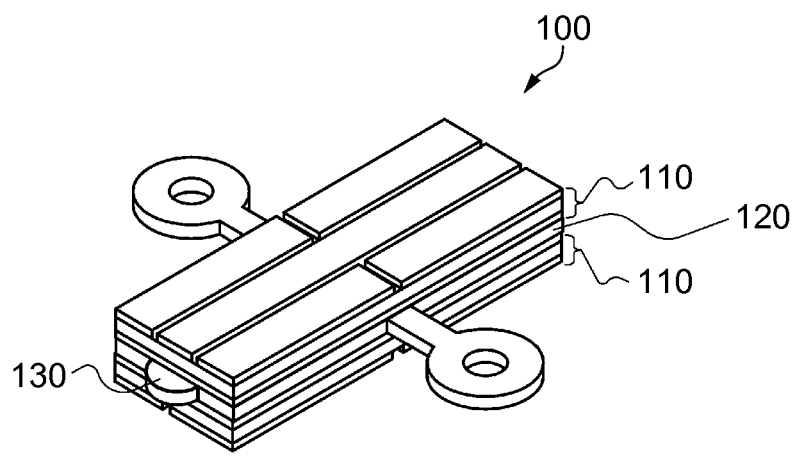
FIG. 2B is a perspective view illustrating an appearance of the piezoelectric actuator.

The piezoelectric actuator 100 is formed by laminating piezoelectric elements 110 on one surface 120b and a back surface 120c of a plate shaped oscillating plate (oscillating portion) 120 by a securing material such as an adhesive agent or a synthetic brazing filler metal as illustrated in FIGS. 2A and 2B. The piezoelectric elements 110 each include a rectangular piezoelectric body 111 having an electrode 112 formed on the side to be bonded to the oscillating plate 120, and an electrode 113 divided into electrodes 113a, 113b, 113c, 113d, and 113e on the other side thereof. Examples of a material of the piezoelectric body 111 include materials having piezoelectricity, for example, lead zirconate titanate (PZT:Pb(Zr,Ti)O$_3$), crystal, lithium niobate (LiNbO$_3$), and in particular, PZT is preferably used. The electrodes 112 and 113 are formed by forming films of electrically-conductive metals such as Au, Ti, and Ag by vapor deposition or spattering. When the material of the oscillating plate 120 has an electrical conductivity, the electrode 112 does not have to be formed, and the oscillating plate 120 may be used as an electrode. The oscillating plate 120 is formed of stainless, nickel alloy, and rubber metal, stainless is used for easiness of machining, and preferably, SUS 301H material, 42 nickel alloy (manufactured by Hitachi Metals, Ltd., YEF42 (trademark)), or the like is used for the piezoelectric actuator 100 of this embodiment. The oscillating plate 120 includes a substantially rectangular base portion 120a, and a driving projection 130 provided at a center of one end of the base portion 120a in the longitudinal direction, which is an urging direction toward the driven member 3 (FIGS. 1A and 1B) so as to project therefrom. The driving projection 130 is formed of aluminum oxide (Al$_2$O$_3$), has an arc shape at a distal end thereof which comes into abutment with the driven member 3 when being urged, and has a form of a separate unit from the base portion 120a. The distal end portion of the driving projection 130 is not limited to be the arc shape, and may be formed into a straight shape. The oscillating plate 120 is provided with mounting portions 120d each having a mounting hole 120e used for mounting the same on the supporting member 4 urged by the coil springs 5.

Figure 3A:
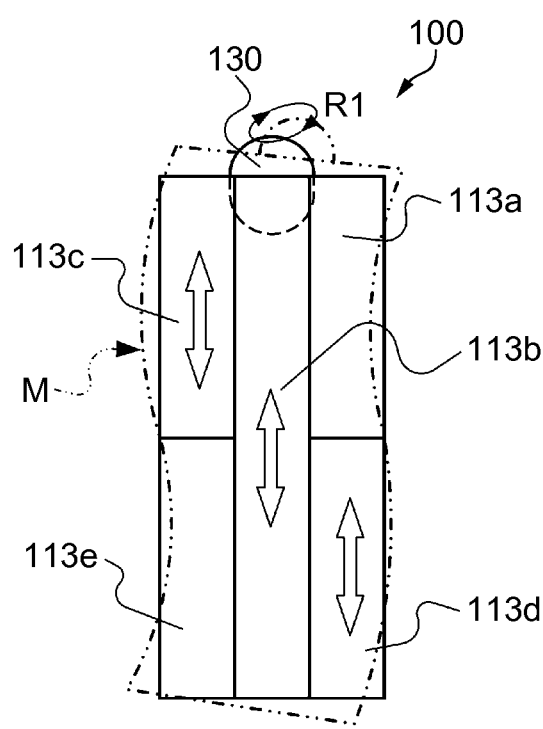
FIGS. 3A and 3B are plan views illustrating oscillation behaviors of the piezoelectric actuator.
Figure 3B:
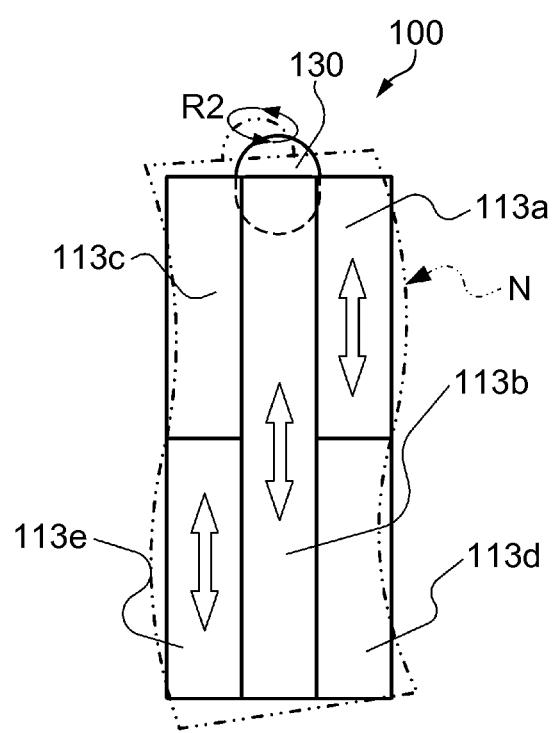

The piezoelectric actuator 100 configured in this manner acts as follows. FIGS. 3A and 3B are plan views illustrating oscillation behaviors of the piezoelectric actuator. As illustrated in FIG. 3A, by applying an AC voltage between the electrodes 113c, 113b, and 113d of the electrode 113 formed on the piezoelectric elements 110 (FIGS. 2A and 2B) and the electrode 112, not illustrated, areas of the piezoelectric body 111 (FIGS. 2A and 2B) where the electrodes 113c, 113b, and 113d are formed are excited to perform longitudinal oscillations illustrated by arrows. Specifically, in the area of the electrode 113b, longitudinal oscillation which causes the piezoelectric actuator 100 to oscillate in the longitudinal direction is excited, and in the areas of the electrodes 113c and 113d, bending oscillation as expressed by a shape M is excited in the piezoelectric actuator 100. Accordingly, the distal end portion of the driving projection 130 provided on the oscillating plate 120 oscillates so as to draw an oval trajectory R1.

In the same manner, as illustrated in FIG. 3B, by applying an AC voltage between the electrodes 113a, 113b, and 113e of the electrode 113 formed on the piezoelectric elements 110 and the electrode 112, not illustrated, the areas of the piezoelectric body 111 where the electrodes 113a, 113b, and 113e are formed are excited to perform longitudinal oscillations illustrated by arrows. Specifically, in the area of the electrode 113b, longitudinal oscillation which causes the piezoelectric actuator 100 to oscillate in the longitudinal direction is excited, and in the areas of the electrodes 113a and 113e, bending oscillation as expressed by a shape N is excited in the piezoelectric actuator 100. Accordingly, the distal end portion of the driving projection 130 provided on the oscillating plate 120 oscillates so as to draw an oval trajectory R2. In this manner, the oscillating plate 120 of the piezoelectric actuator 100 converts the oscillation excited by the piezoelectric elements 110 into the oscillation of the driving projection 130 having the oval trajectories R1 and R2.

Returning back to FIGS. 1A and 1B, the driven member 3 of the piezoelectric motor 1 is formed of aluminum oxide (Al$_2$O$_3$), and is installed on the base 2 by a rotating unit including a rotating shaft 7 and a bearing 8. A rotational force of the rotating shaft 7 is transmitted to another apparatus (not illustrated) via a deceleration or acceleration apparatus 9 to which the rotating shaft 7 is connected.

The supporting member 4 includes guide holes 4a and guide pins 2a are inserted into the guide holes 4a and slidably fixed to the base 2. The guide holes 4a have a flat truck shape to allow the supporting member 4 to slide in a direction in which the piezoelectric actuator 100 is urged. The supporting member 4 is mounted in such a manner that ends of the coil springs 5 on one side are mounted on fixing arms 4b for mounting the piezoelectric actuator 100 and ends of the coil springs 5 on the other side are mounted on spring mounting portions 2b provided on the base 2. Accordingly, the supporting member 4 is urged toward the driven member 3. For reference, a configuration in which the supporting member 4 is urged by using, for example, leaf springs, resilient rubber, or the like instead of the coil spring 5 is also applicable.

The mounting portions 120d of the oscillating plate 120 are placed on the fixed arms 4b of the supporting member 4, and the piezoelectric actuator 100 is fixed to the fixed arms 4b by the screws 6. The driving projection 130 provided on the fixed piezoelectric actuator 100 is urged by the supporting member 4 toward the driven member 3 by a predetermined force. The piezoelectric motor 1 configured in this manner drives the driven member 3 to rotate by the oscillating behaviors of the piezoelectric actuator 100 along the oval trajectories R1 and R2. The piezoelectric motor 1 is small, yet capable of converting the oscillation of the piezoelectric body 111 efficiently into a driving oscillation of the driving projection 130, and is capable of generating a large driving amount (output).

Figure 4A:
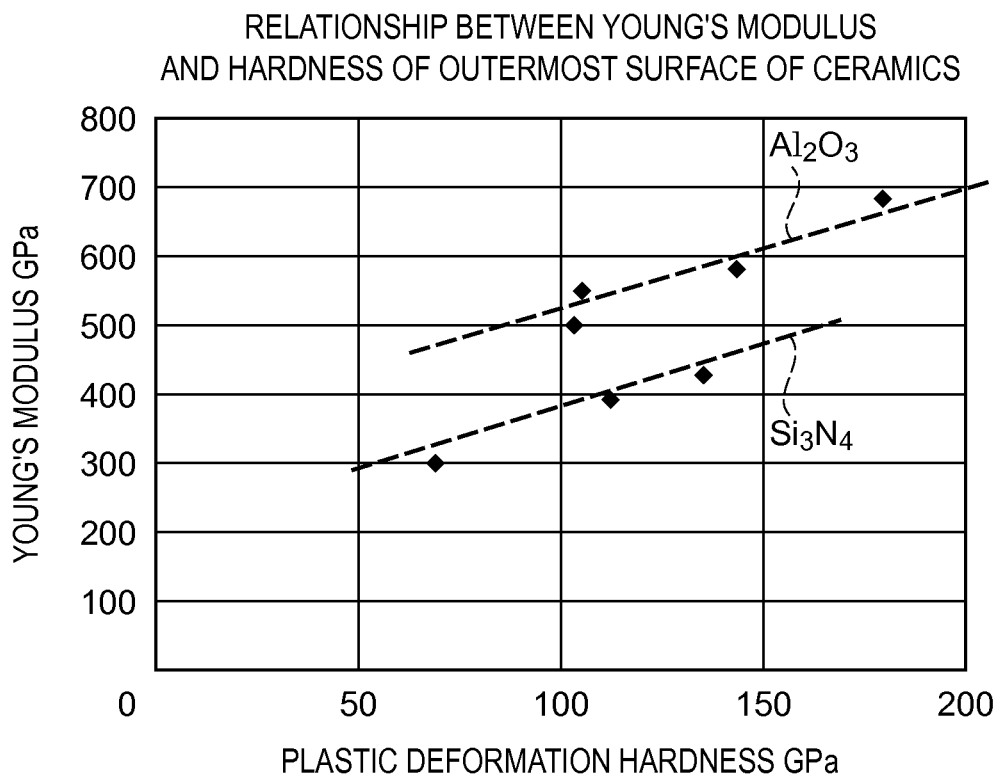
FIG. 4A is a graph chart showing a relationship between plastic deformation hardness and Young's modulus on an outermost surface of ceramics.
Figure 4B:
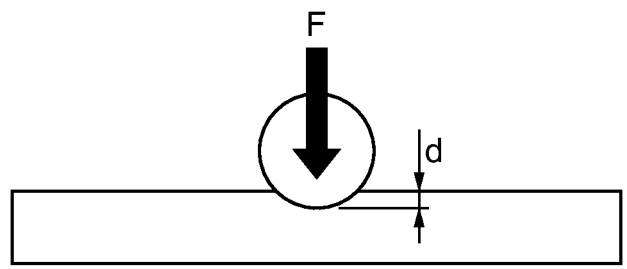
FIG. 4B is a schematic drawing showing a relationship between a pushing load and a pushing depth of ceramics.

Subsequently, a relationship between the driving projection 130 and the driven member 3 which is driven by the abutment with the driving projection 130 in a sliding motion of the piezoelectric motor 1 will be described. FIG. 4A is a graph chart showing a relationship between plastic deformation hardness and Young's modulus on an outermost surface of ceramics. FIG. 4B is a schematic chart showing a relationship between a pushing load and a pushing depth of the ceramics. The graph chart in FIG. 4A shows cases of aluminum oxide (Al$_2$O$_3$), which is the ceramics which forms the driving projection 130 and the driven member 3 (FIGS. 1A and 1B), and of silicon nitride (Si$_3$N$_4$), which is another type of ceramics. The vertical axis to the graph indicates Young's modulus (GPa) of ceramics, and the lateral axis indicates plastic deformation hardness (GPa) of the ceramics. The Young's modulus in this case is a measurement value on the outermost surface of the aluminum oxide. The term "outermost surface" here indicates an area on the order of 30 to 200 nm, which is a cutting depth of an indenter at a load of 1 mN to 10 mN, and is an area which is measurable by a nano-indenter (ENT1100 (trademark) manufactured by ELIONIX INC., for example).

As shown in FIG. 4A, the relationships between the plastic deformation hardness and the Young's modulus of aluminum oxide and silicon nitride demonstrated the substantially same transition such that the Young's modulus was increased as increase in plastic deformation hardness. However, the value of the Young's modulus of the aluminum oxide was larger than that of the silicon nitride even though the plastic deformation hardness was the same. From this relationship, understanding as described below was possible. In other words, among sliding parts formed of ceramics, sliding parts formed of silicon nitride having plastic deformation hardness higher than that of aluminum nitride demonstrated a tendency to be inferior in abrasion resistance irrespective of having plastic deformation hardness higher than that of sliding parts formed of aluminum oxide. The reason was found to be because the Young's modulus of silicon nitride in the vicinity of the outermost surface as a sliding surface was lower than that of aluminum oxide even though the plastic deformation hardness was the same.

FIG. 4B shows a depth d of indentation of the surface of aluminum oxide or silicon nitride when being pressed by the indenter at a load F. Materials having low Young's modulus were subject to larger resilient deformation at the load F in comparison with materials having higher Young's modulus, that is, the depth d of indentation was larger in the former case. Accordingly, even though the plastic deformation hardness was the same as aluminum oxide, the depth d in the case of silicon nitride having low Young's modulus was larger than the depth d in the case of the aluminum oxide. Therefore, silicon nitride was subject to a sliding motion of an indenter on the surface thereof in a state of being indented to a large depth d, and hence was subject to abrasion in comparison with aluminum oxide, so that was inferior in abrasion resistance. As regards the comparison among a plurality of types of aluminum oxide, if the Young's modulus is different, the difference in abrasion resistance as described above may result even though the plastic deformation hardness is the same.

Figure 5A:
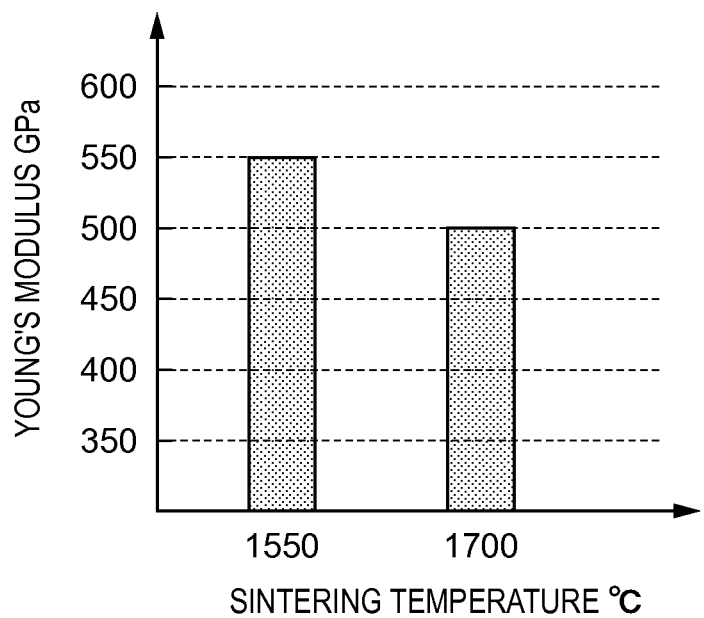
FIG. 5A is a graph chart showing a relationship between a sintering temperature and Young's modulus of aluminum oxide.
Figure 5B:
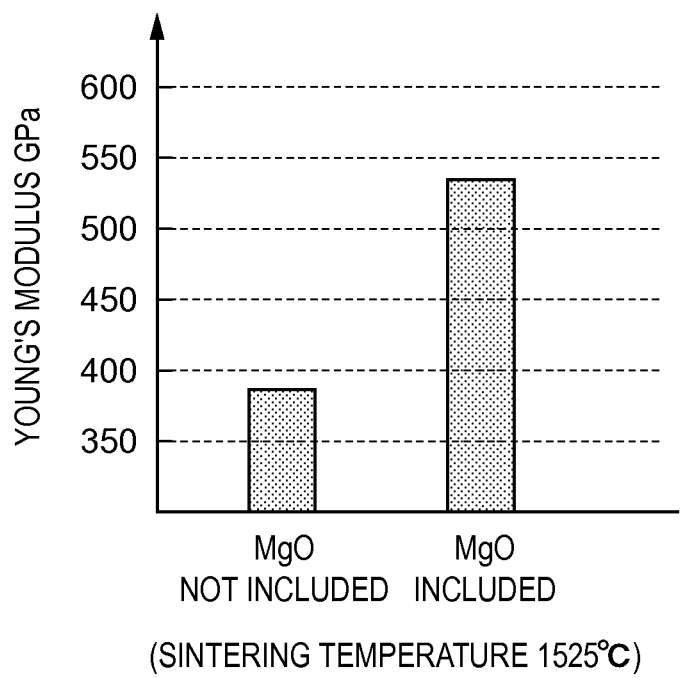
FIG. 5B is a graph chart showing a relationship between the degree of presence or absence of inclusion of magnesium oxide in the aluminum oxide and Young's modulus.

The Young's modulus may be controlled by conditions of formation of ceramics. FIG. 5A is a graph chart showing the relationship between a sintering temperature and Young's modulus of aluminum oxide. FIG. 5B is a graph chart showing the relationship between the presence or absence of inclusion of magnesium oxide in the aluminum oxide and Young's modulus. Although these graph charts show the Young's modulus in the cases where magnesium oxide is included and not included in aluminum oxide ($Al_2O_3$) which forms the driving projection 130 and the driven member 3, almost the same tendency was obtained in the cases other than aluminum oxide as long as it was ceramics.

FIG. 5A shows Young's modulus (GPa) of aluminum oxide on the vertical axis and sintering temperatures (° C.) of the aluminum oxide on the lateral axis. As shown in the graph, in the case of a sintering temperature of 1550° C., Young's modulus was 550 GPa, and in the case of a sintering temperature of 1700° C., Young's modulus was 500 GPa. It was found, in other words, that Young's modulus of aluminum oxide was increased with decrease in sintering temperature.

FIG. 5B shows Young's modulus (GPa) of aluminum oxide on the vertical axis and the presence or absence of inclusion of magnesium oxide in aluminum oxide on the lateral axis. In this case, the sintering temperature was 1525° C. As shown in the graph chart, Young's modulus of aluminum oxide including no magnesium oxide was 380 GPa, and Young's modulus of aluminum oxide including magnesium oxide was 540 GPa. It was found, in other words, that the Young's modulus of aluminum oxide was higher when including magnesium.

In the piezoelectric motor 1, Young's modulus E1 of aluminum oxide which forms the driving projection 130 of the piezoelectric actuator 100 and Young's modulus E2 of aluminum oxide which forms the driven member 3 are set to have a relationship of E1≠E2, and also to be E1<E2. In this setting, the driving projection 130 is subject to abrasion in comparison with the driven member 3 in a sliding motion between the driving projection 130 and the driven member 3, so that the abrasion resistance of the driven member 3 which is coupled to other apparatuses or the like and hence cannot be mounted and demounted easily is relatively improved. Therefore, in the piezoelectric motor 1, the piezoelectric actuator 100 having the driving projection 130 is replaced in accordance with the degree of abrasion. In this manner, the piezoelectric motor 1 includes the driving projection 130 and the driven member 3 having optimal abrasion resistance in accordance with the required function as a motor, allows reduction in size, and has high durability.

Second Embodiment

Figure 6A:
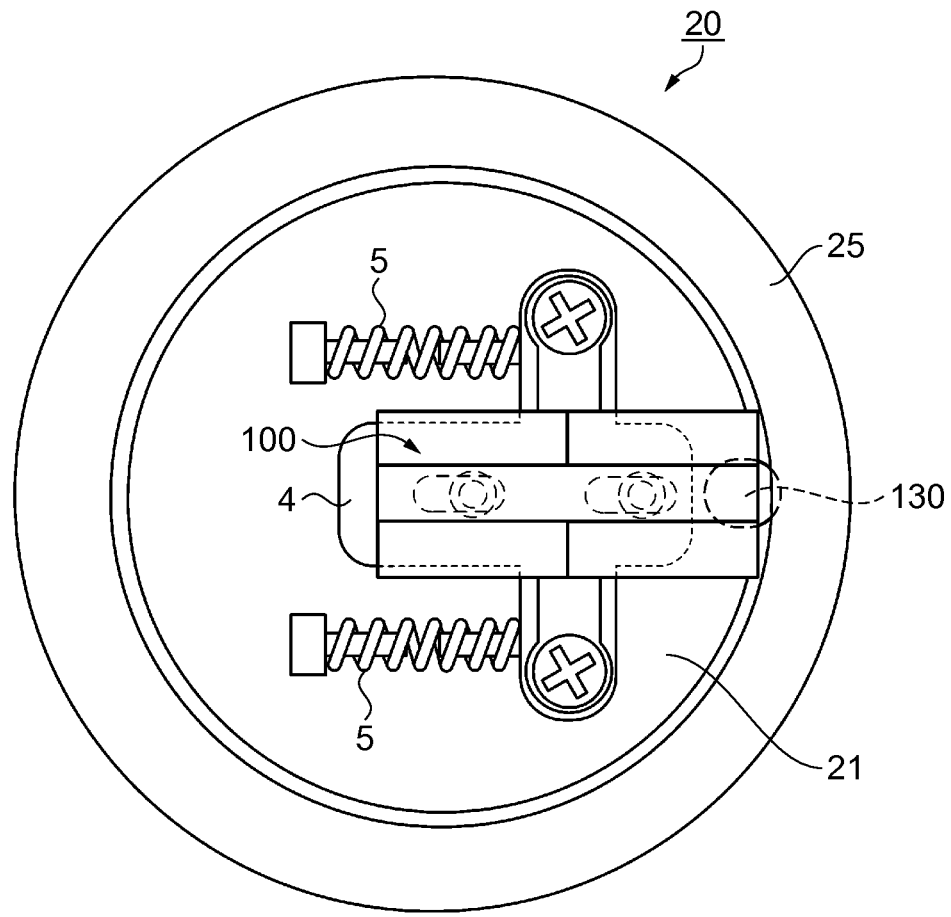
FIG. 6A is a plan view illustrating a drive unit of a second embodiment.

Subsequently, a mechanism of the piezoelectric motor 1, that is, a drive unit provided with the piezoelectric elements 110, the oscillating plate 120, the driving projection 130, and a driven member driven by the driving projection 130 will be described. FIG. 6A is a plan view illustrating the drive unit according to a second embodiment, and FIG. 6B is a cross-sectional view illustrating the drive unit.

Figure 6B:
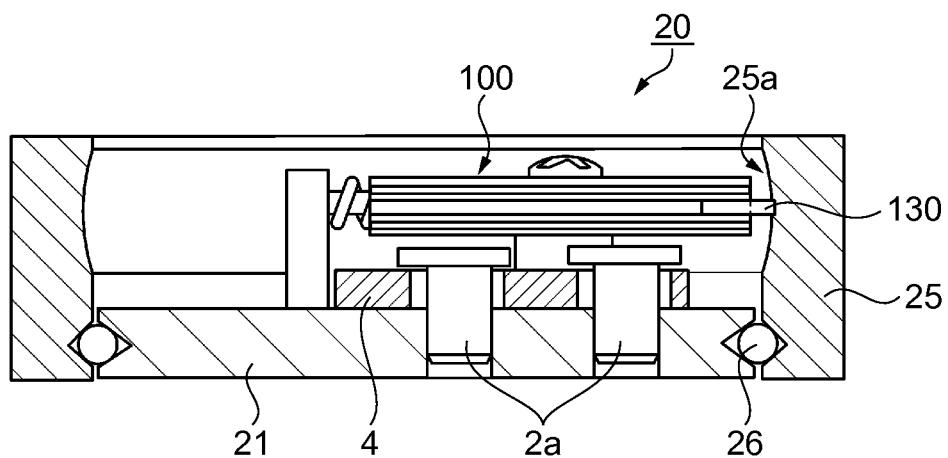
FIG. 6B is a cross-sectional view illustrating the drive unit.

As illustrated in FIGS. 6A and 6B, a drive unit 20 includes a base 21, the supporting member 4 fixed to the base 21, the piezoelectric actuator 100 provided on the supporting member 4 and including the driving projection 130, and a driven member 25 to be driven by the abutment with the driving projection 130. The driven member 25 has a ring shape having an inner peripheral surface 25a which comes into abutment with the driving projection 130. The inner peripheral surface 25a of the driven member 25 is formed to be depressed in the direction of diameter thereof. The driven member 25 is held so as to be rotatable with respect to the base 21 by ball bearings 26. The drive unit 20 includes the driving projection 130 and the driven member 25 formed of aluminum oxide ($Al_2O_3$). The Young's modulus E1 of aluminum oxide which forms the driving projection 130 and the Young's modulus E2 of aluminum oxide which forms the driven member 25 are set to have a relationship of E1<E2. In this setting, the driving projection 130 is subject to abrasion in comparison with the driven member 25 in the sliding motion between the driving projection 130 and the driven member 25. Accordingly, the abrasion resistance of the driven member 25 rotatably supported by the base 21 is set to be increased relatively with respect to the driving projection 130. Therefore, in the drive unit 20, abraded driving projection 130 is replaced by changing the piezoelectric actuator 100 which is easily mountable and demountable in accordance with the degree of abrasion. In this manner, the drive unit 20 includes the driving projection 130 and the driven member 25 having optimal abrasion resistance in accordance with the required function, allows reduction in size, and also has high durability. The drive unit 20 is not limited to a mode including the ring-shaped driven member 25 configured to rotate, and a configuration in which the driven member has a linear shape and is configured to be driven linearly is also applicable.

Third Embodiment

Figure 7:
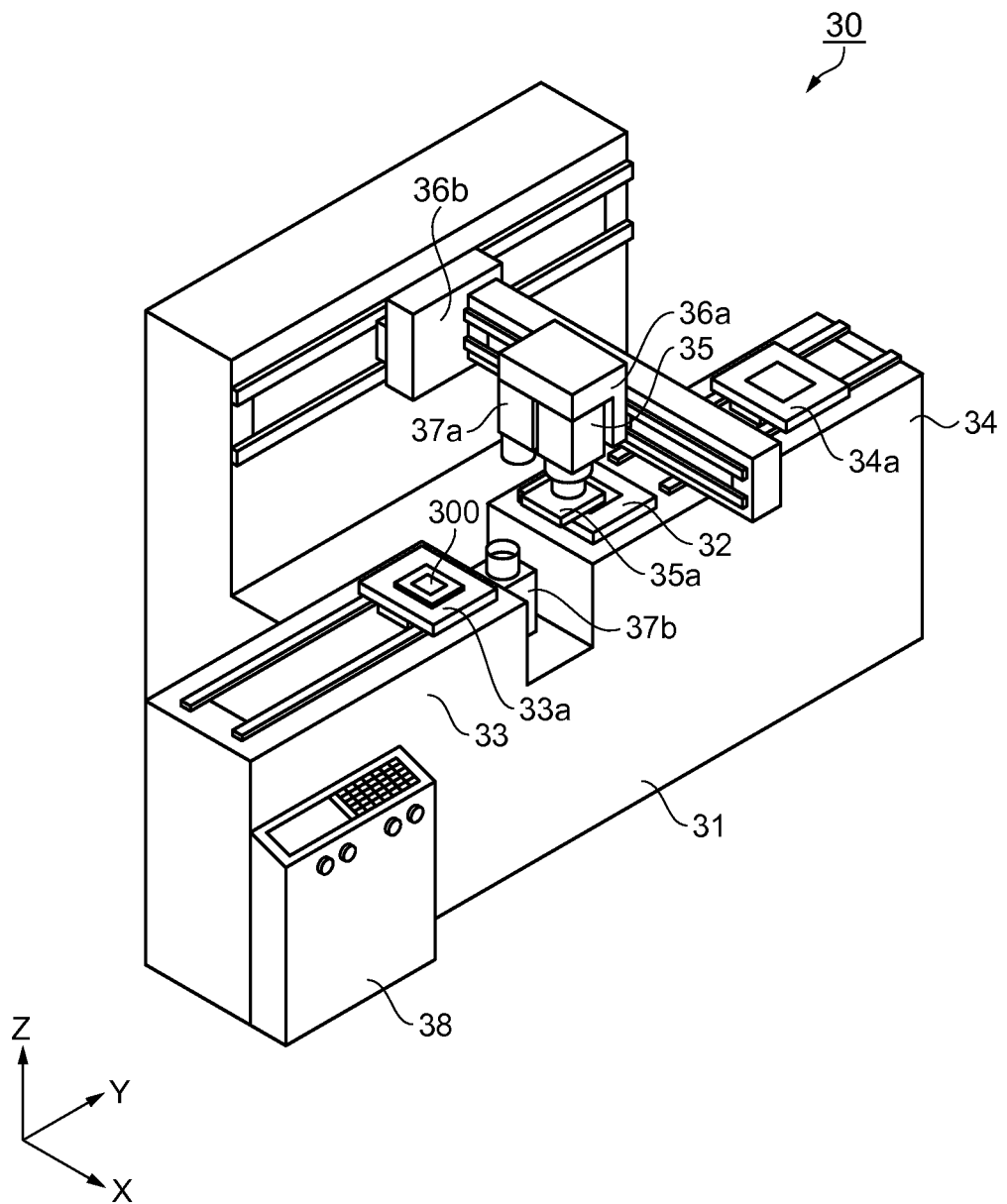
FIG. 7 is a perspective view illustrating an electronic part inspection apparatus of a third embodiment.
Figure 8:
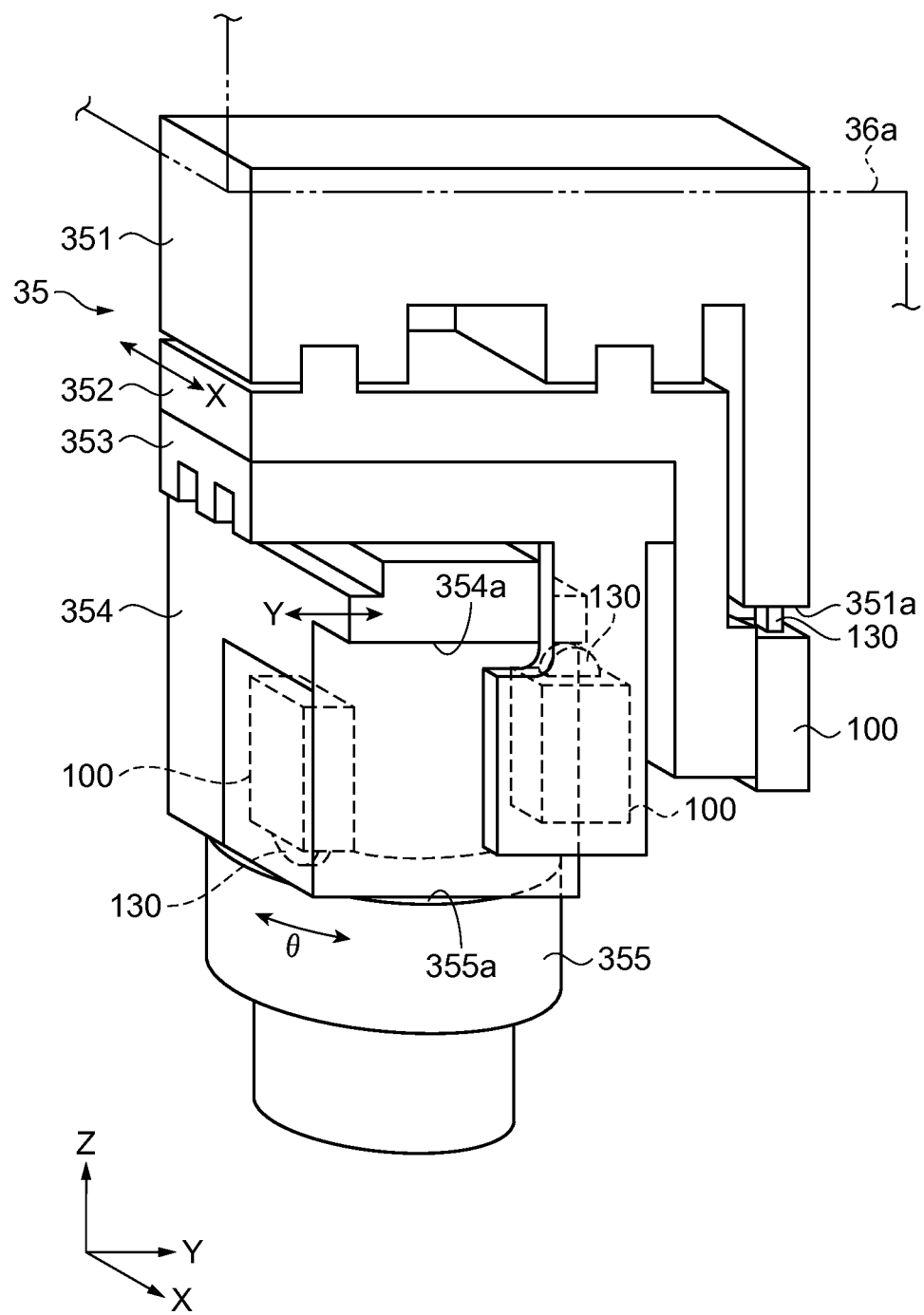
FIG. 8 is a perspective view illustrating a correcting mechanism portion of the electronic part inspection apparatus.

Subsequently, the mechanism of the piezoelectric motor 1, that is, an electronic part inspection apparatus provided with the piezoelectric elements 110, the oscillating plate 120, the driving projection 130, and the driven member driven by the driving projection 130 will be described. FIG. 7 is a perspective view illustrating the electronic part inspection apparatus according to a third embodiment, and FIG. 8 is a perspective view illustrating a correcting mechanism portion of the electronic part inspection apparatus. As illustrated in FIG. 7, an electronic part inspection apparatus 30 includes a parallelepiped base 31 and a control apparatus 38 configured to control the electronic part inspection apparatus 30 on a side portion of the base 31. Here, the longitudinal direction of the base 31 is defined as a Y-direction (lateral direction) and a direction orthogonal to the Y-direction on a horizontal plane is defined as an X-direction (fore-and-aft direction), and the vertical direction is defined as a Z-direction (upper and lower direction), and a direction of rotation of the correcting mechanism portion is defined as θ. For reference, the electronic part inspection apparatus 30 includes an electronic part transfer apparatus integrated therein. The electronic part inspection apparatus 30 includes on the base 31, a material supply unit 33 disposed on the left side of the base 31, and a placing stage 33a provided on an upper surface of the material supply unit 33 and configured to reciprocate along the Y-direction by a guide rail. An electronic part 300 is placed on the placing stage 33a. On the base 31, an image pickup unit 37b configured to photograph one side of the electronic part 300 is installed in the vicinity of the center of the base 31, which is an end portion of the material supply unit 33.

The electronic part inspection apparatus 30 includes an inspection table 32 installed on the side of the image pickup unit 37b opposite from the material supply unit 33 as a jig for transmitting and receiving an electric signal when inspecting the electronic part 300, a material removing apparatus 34 installed on the side of the inspection table 32 opposite from the image pickup unit 37b, and a placing stage 34a provided on an upper surface of the material removing apparatus 34 and configured to reciprocate along the Y-direction by the guide rail. The electronic part 300 inspected by the inspection table 32 is placed on the placing stage 34a for removing the material. In addition, the electronic part inspection apparatus 30 includes a Y moving portion (electronic part transfer apparatus) 36b provided above the base 31 and configured to reciprocate in the Y-direction, an X moving portion (electronic part transferring apparatus) 36a provided on the Y moving portion 36b and configured to move in the X-direction, an image pickup unit 37a provided on the X moving portion 36a and configured to photograph the other end side of the electronic part 300, a correcting mechanism portion (electronic part transferring apparatus) 35 provided on the X moving portion 36a and configured to fine-adjust the position of the electronic part 300 (X, Y, θ), and a Z moving portion (electronic part transferring apparatus, not illustrated) configured to move the correcting mechanism portion 35 in the Z-direction. The correcting mechanism portion 35 includes a grip portion 35a configured to grip the electronic part 300, and is configured to fine-adjust the position of the electronic part 300 with respect to the inspection table 32 on the basis of positional data of the electronic part 300 photographed by the image pickup units 37a and 37b. This fine adjustment is performed to achieve further precise positional adjustment in addition to the movement by the X moving portion 36a and the Y moving portion 36b. Accordingly, the electronic part 300 is placed accurately on the inspection table 32 and is inspected.

Subsequently, a configuration of the correcting mechanism portion 35 will be described. FIG. 8 is a perspective view illustrating the correcting mechanism portion of the electronic part inspection apparatus. As illustrated in FIG. 8, the correcting mechanism portion 35 includes a basal portion 351 fixed to the X moving portion 36a, and an X correcting portion 352 movable by engaging a groove provided on a lower surface of the basal portion 351 along the X-direction. The basal portion 351 is provided with a downward facing abutting surface 351a at an end of an extending portion extending downward from the basal portion 351, and the piezoelectric actuator 100 is provided on the X correcting portion 352. Then, the driving projection 130 of the piezoelectric actuator 100 is installed so as to come into abutment with the abutting surface 351a of the basal portion 351. When the piezoelectric actuator 100 is driven, the piezoelectric actuator 100 moves along the abutting surface 351a, and in association therewith, the X correcting portion 352 moves in the X-direction.

The correcting mechanism portion 35 includes a corrected base portion 353 fixed to a lower portion of the X correcting portion 352 and a Y correcting portion 354 movable by engaging a groove provided on a lower surface of the corrected base portion 353 along the Y-direction. The Y correcting portion 354 is provided with a downward facing abutting surface 354a on a protruding portion of the Y correcting portion 354, and the corrected base portion 353 is provided with the piezoelectric actuator 100. Then, the driving projection 130 of the piezoelectric actuator 100 is installed so as to come into abutment with the abutting surface 354a of the Y correcting portion 354. When the piezoelectric actuator 100 is driven, the Y correcting portion 354 having the abutting surface 354a is moved in the Y-direction.

Furthermore, the correcting mechanism portion 35 is provided with a rotating body 355 on the lower portion of the Y correcting portion 354 so as to be rotatable. The rotating body 355 is provided with an abutting surface 355a on an upper surface thereof, and the piezoelectric actuator 100 is provided on the Y correcting portion 354. Then, the driving projection 130 of the piezoelectric actuator 100 is installed so as to come into abutment with the abutting surface 355a of the rotating body 355. When the piezoelectric actuator 100 is driven, the rotating body 355 having the abutting surface 355a rotates in the direction θ. The rotating body 355 is provided with the grip portion 35a (FIG. 7), not illustrated. The correcting mechanism portion 35 in this configuration achieves a fine positional adjustment reliably in the directions X, Y, and θ by the three piezoelectric actuators 100.

Here, in the electronic part inspection apparatus 30, the driving projection 130 of the piezoelectric actuator 100 is formed of aluminum oxide ($Al_2O_3$), and in the basal portion 351, the Y correcting portion 354, and the rotating body 355, at least the abutting surfaces 351a, 354a, and 355a are formed of aluminum oxide ($Al_2O_3$). Then, the Young's modulus E1 of the aluminum oxide which forms the driving projection 130 of the piezoelectric actuator 100 and the Young's modulus E2 of the aluminum oxide which forms the abutting surfaces 351a, 354a, and 355a of the basal portion 351, the Y correcting portion 354, and the rotating body 355 as the driven members are set to have a relationship of E1<E2. In this setting, the driving projection 130 is subject to abrasion in comparison with the abutting surfaces 351a, 354a, and 355a in a sliding motion between the driving projection 130 and the abutting surfaces 351a, 354a, and 355a, so that the abrasion resistance of the abutting surfaces 351a, 354a, and 355a is relatively improved. Therefore, in the electronic part inspection apparatus 30, the piezoelectric actuator 100 having the driving projection 130 which may be easily be mounted and demounted in comparison with the basal portion 351, the Y correcting portion 354, and the rotating body 355 is replaced in accordance with the degree of abrasion. In this manner, the electronic part inspection apparatus 30 includes the driving projection 130 and the driven member (the basal portion 351, the Y correcting portion 354, and the rotating body 355) having optimal abrasion resistances according to the required position adjusting function as the inspection apparatus, so that reduction in size and increase in durability of the correcting mechanism portion 35 is achieved.

Fourth Embodiment

Figure 9A:
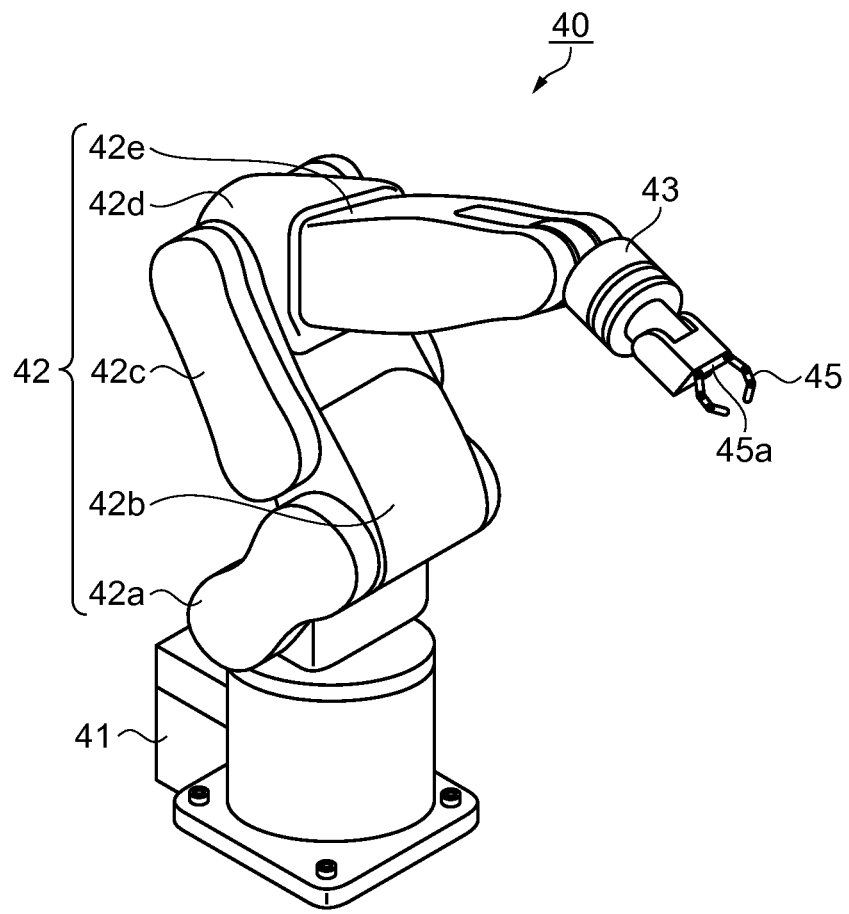
FIG. 9A is a perspective view illustrating a robot of a fourth embodiment.
Figure 9B:
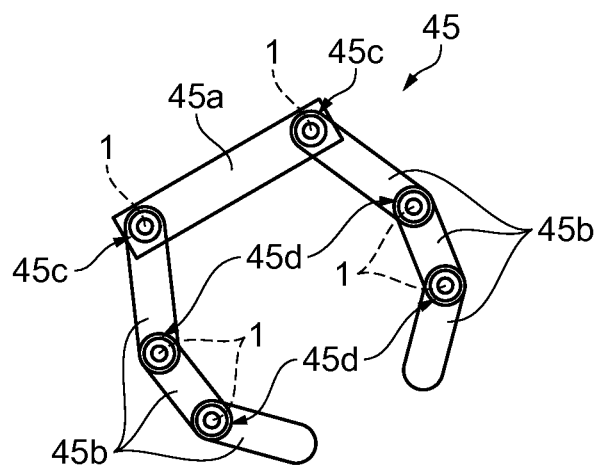
FIG. 9B is a plan view illustrating a robot hand of the robot having piezoelectric motors.

Subsequently, a robot characterized by having the piezoelectric motors 1 will be described. FIG. 9A is a perspective view illustrating the robot provided with a hand having the piezoelectric motors, and FIG. 9B is a plan view illustrating a robot hand of the robot. As illustrated in FIG. 9A, a robot 40 includes a main body portion 41, an arm portion 42, and a robot hand 45. The main body portion 41 is fixed to an upper surface of floor, wall, ceiling, or a movable carriage. The arm portion 42 is provided so as to be movable with respect to the main body portion 41, and the main body portion 41 includes a driving portion (not illustrated) configured to generate a motive power for rotating the arm portion 42 and a control unit configured to control the driving portion integrated therein.

The arm portion 42 includes first frames 42a, a second frame 42b, third frames 42c, a fourth frame 42d, and a fifth frame 42e. The first frames 42a are connected to the main body portion 41 so as to be rotatable and inflectable via a shaft of rotation and inflection. The second frame 42b is connected to the first frames 42a and the third frames 42c via shafts of rotation and bending. The third frames 42c are connected to the second frame 42b and the fourth frame 42d via shafts of rotation and bending. The fourth frame 42d is connected to the third frames 42c and the fifth frame 42e via shafts of rotation and bending. The fifth frame 42e is connected to the fourth frame 42d via a shaft of rotation and inflection. The arm portion 42 is configured so that the respective frames 42a to 42e move by compositely rotating or inflecting about the respective shafts of rotation and inflection by being controlled by the control unit.

A hand connecting portion 43 is connected to the fifth frame 42e of the arm portion 42 on the side opposite from the side where the fourth frame 42d is provided, and the robot hand 45 is mounted on the hand connecting portion 43.

The robot hand 45 is provided with a basal portion 45a and finger portions 45b connected to the basal portion 45a as illustrated in FIG. 9B. The piezoelectric motors 1 are integrated in connecting portions 45c between the basal portion 45a and the finger portions 45b, and joint portions 45d of the finger portions 45b. By driving the piezoelectric motors 1, the finger portions 45b bend and hence may hold an object. The piezoelectric motors 1 are extremely compact motor, so that the robot hand 45 which is small, yet capable of gripping the object reliably is realized. Accordingly, the robot 40 having general versatility, which is capable of performing complex actions using the small and light robot hand 45, may be provided.

Fifth Embodiment

Figure 10A:
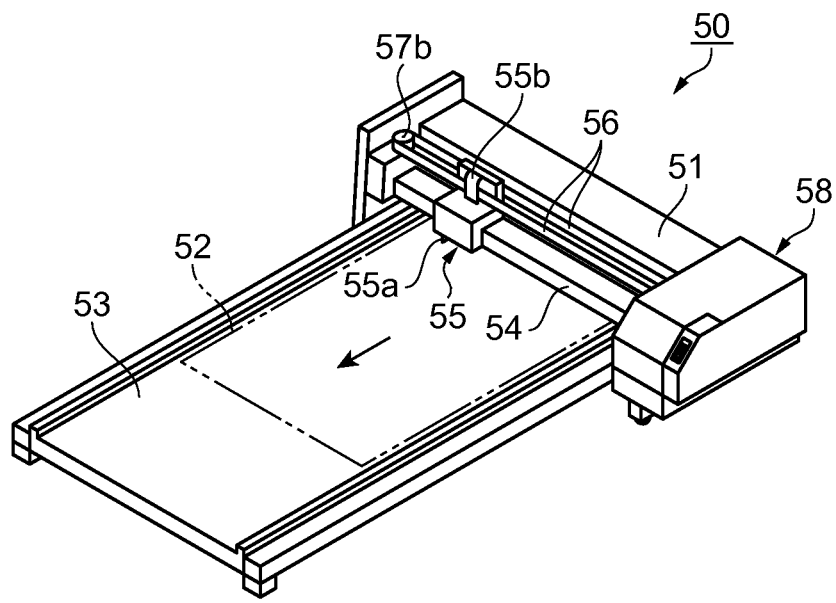
FIG. 10A is a perspective view illustrating a printer of a fifth embodiment.

Subsequently, a printer characterized by having the piezoelectric motors 1 will be described. FIG. 10A is a perspective view illustrating the printer according to a fifth embodiment, and FIG. 10B is a plan view illustrating a cutting head of the printer.

As illustrated in FIG. 10A, a printer 50 includes a printing unit 51 configured to perform printing on a printing sheet 52, a platen 53 as a stage configured to hold and guide the printing sheet 52 with the cooperation of the printing unit 51, a cutting head 55 configured to cut the printed printing sheet 52, and a control unit 58 configured to control the printer 50. In this case, the cutting head 55 has a system of cutting the printing sheet 52 in the direction orthogonal to the direction of transport of the printing sheet 52, and includes a cutter 55a for cutting the printing sheet 52.

Figure 10B:
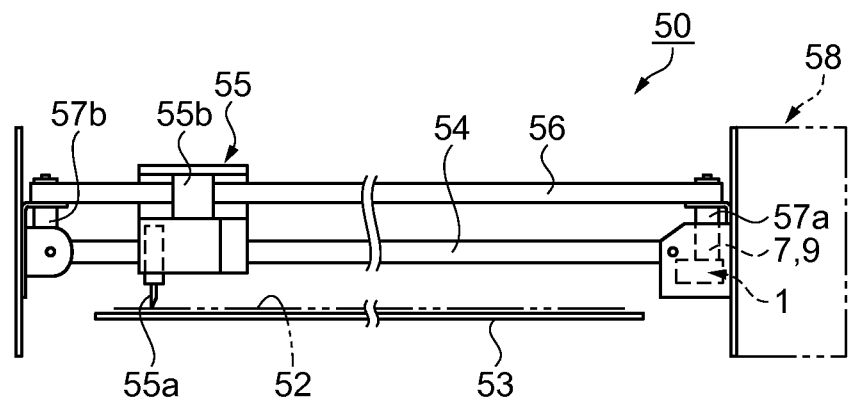
FIG. 10B is a plan view illustrating a cutting head of the printer.

As illustrated in FIG. 10B, a mechanism for cutting the printing sheet 52 includes a guide rail 54 configured to support the cutting head 55 and guide the movement of the cutting head 55, a ring-shaped belt 56 configured to move the cutting head 55 along the guide rail 54, a belt coupling portion 55b configured to couple the cutting head 55 to the ring-shaped belt 56, and a drive shaft 57a and a driven shaft 57b provided at a starting end and a terminating end of the movement of the cutting head 55.

The drive shaft 57a is rotated by the piezoelectric motor 1 and drives the ring-shaped belt 56. In this case, the rotation of the rotating shaft 7 of the piezoelectric motor 1 is transmitted to the drive shaft 57a via the deceleration or acceleration apparatus 9. The printer 50 in this configuration is configured in such a manner that the drive shaft 57a rotates when the piezoelectric motor 1 is driven, the ring-shaped belt 56 rotates between the drive shaft 57a and the driven shaft 57b by the rotation of the drive shaft 57a, and the cutting head 55 coupled to the rotating ring-shaped belt 56 moves along the guide rail 54. Accordingly, the cutter 55a of the cutting head 55 cuts the printing sheet 52.

Since a portion around the drive shaft 57a may be formed to be compact by using the piezoelectric motor 1 for driving the drive shaft 57a, the printer 50 may be reduced in size, and also has a high durability.

Sixth Embodiment

Figure 11A:
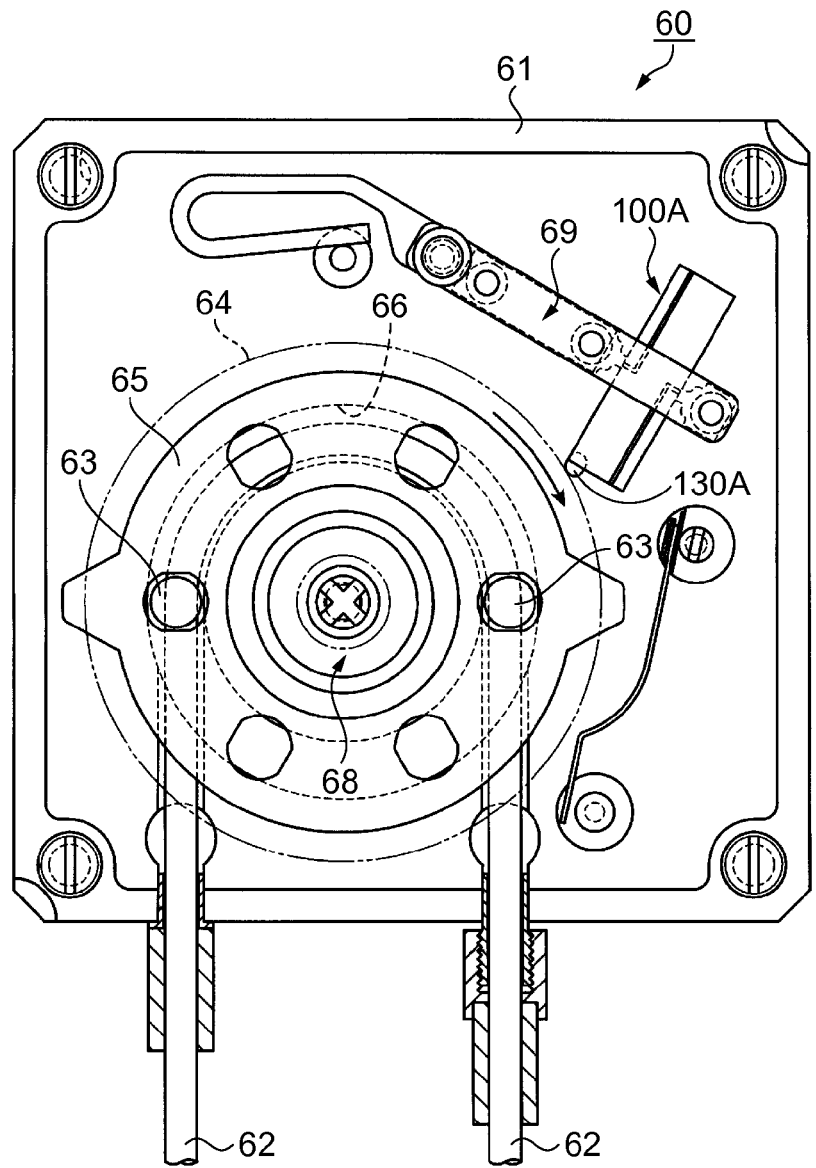
FIG. 11A is a plan view illustrating a liquid ejecting apparatus of a sixth embodiment.
Figure 11B:
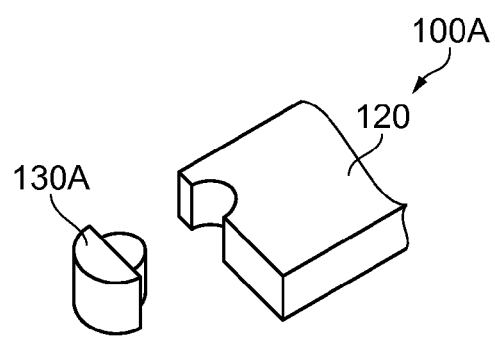
FIG. 11B is a cross-sectional view illustrating a configuration of a driving projection of the liquid ejecting apparatus.
Figure 12:
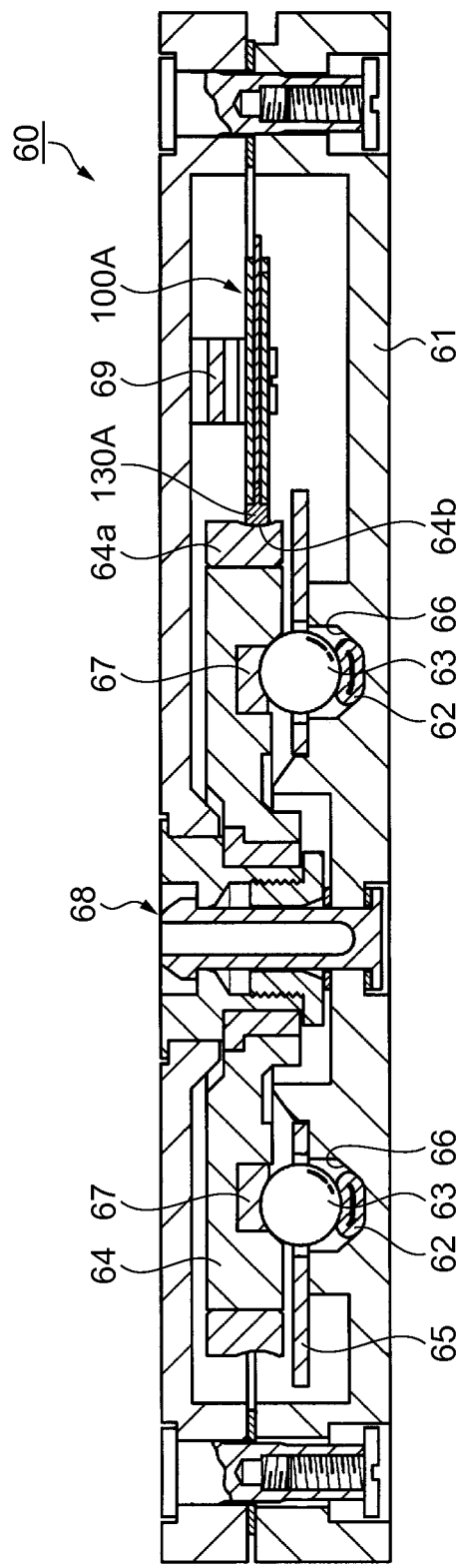
FIG. 12 is a cross-sectional view illustrating the liquid ejecting apparatus.

Subsequently, a liquid ejecting apparatus having a mechanism of the piezoelectric motor 1, that is, the piezoelectric elements 110, the oscillating plate 120, the driving projection, and a driven member driven by the driving projection will be described. FIG. 11A is a plan view illustrating the liquid ejecting apparatus according to a sixth embodiment, and FIG. 11B is a cross-sectional view illustrating the configuration of the driving projection of the liquid ejecting apparatus. FIG. 12 is a cross-sectional view illustrating the liquid ejecting apparatus.

As illustrated in FIG. 11A and FIG. 12, a liquid ejecting apparatus 60 includes a tube 62 to allow liquid to pass therethrough, balls 63 configured to press the tube 62, a rotor 64 configured to cause the balls 63 to roll on the tube 62, a piezoelectric actuator 100A held by a holding member 69 and configured to drive the rotor 64 to rotate, and a retainer 65 configured to define a rolling trajectory of the balls 63. A part of the tube 62, the balls 63, the rotor 64, the piezoelectric actuator 100A and the rotor 64 as components are accommodated in a base member 61. In FIG. 12, a state in which the tube 62 is pressed by the balls 63 is illustrated.

The base member 61 is formed with a tube guide groove 66 in which the tube 62 is arranged. The tube guide groove 66 includes an arc-shaped portion and two linear portions to guide the tube 62 to the outside of the base member 61, and is formed into a U-shape. Although the material of the tube 62 employed here is silicone rubber, polyurethane or other resilient materials may be employed. Two of the balls 63 are provided, and are arranged equidistantly (180° interval) along the arc-shaped portion of the tube guide groove 66 on the side opposite from the side where the tube 62 comes into abutment with the tube guide groove 66.

The rotor 64 is formed of polycarbonate or other materials equivalent to polycarbonate into an annular shape, and a ring 64a (driven member) formed of aluminum oxide is press-fitted in the outer periphery thereof. The outer periphery of the ring 64a is formed with a depression 64b having a shape of an arcuate depression in cross section. A driving projection 130A of the piezoelectric actuator 100A comes into abutment with the depression 64b. The rotor 64 is rotatably supported by a rotor shaft 68 fixed to the base member 61. Then, a pressing rubber 67 is provided on a surface opposing the balls 63 of the rotor 64, and is in abutment with the balls 63. Here, the distance between the rotor 64 and the tube guide groove 66 is set to be smaller than the sum of the diameter of the balls 63 and the diameter of the tube 62, and the balls 63 are pressed against the tube 62 by the pressing rubber 67 of the rotor 64, so that the tube 62 is collapsed along the shape of the tube guide groove 66.

Here, as illustrated in FIG. 11B, the driving projection 130A of the piezoelectric actuator 100A is provided at a corner side at an end of the oscillating plate 120. The driving projection 130A is formed of aluminum oxide, and is provided on the oscillating plate 120 as a separate unit. In other words, in the liquid ejecting apparatus 60, the piezoelectric actuator 100A, the driving projection 130A, and the ring 64a which is a driven member constitute a configuration equivalent to the mechanism of the piezoelectric motor.

The liquid ejecting apparatus 60 in this configuration acts as follows. When a voltage is applied to the piezoelectric actuator 100A, the driving projection 130A of the piezoelectric actuator 100A oscillates so as to draw an oval trajectory. Then, by the abutment with the driving projection 130A with the depression 64b of the ring 64a, the rotor 64 is pushed in the direction of rotation. By repeating such actions, the rotor 64 is rotated at a desired number of rotations.

When the rotor 64 is rotates, the balls 63 pressed by the pressing rubber 67 roll while collapsing the tube 62. Accordingly, liquid in a state of being sandwiched between the two balls 63 in the tube 62 and liquid sucked from one end of the tube 62 is ejected from the other end thereof. By repeating this operation at a predetermined number of rotations, the liquid in the tube 62 may be ejected continuously.

In the liquid ejecting apparatus 60 configured as described thus far, the driving projection 130A of the piezoelectric actuator 100A is formed of aluminum oxide, and the Young's modulus E1 thereof and the Young's modulus E2 of the aluminum oxide which forms the ring 64a as the driven member are set to have a relationship of E1<E2. In this setting, the ring 64a is subject to abrasion in comparison with the driving projection 130A in a sliding motion between the driving projection 130A and the ring 64a, so that the abrasion resistance of the driving projection 130A is relatively improved. Therefore, in this configuration, the ring 64a is replaced at the time of maintenance or the like in accordance with the extent of abrasion. In this manner, the liquid ejecting apparatus 60 includes the driving projection 130A having optimal abrasion resistance in accordance with the required function as an ejecting apparatus and the ring 64a as the driven member, so that reliable operation may be maintained.

Seventh Embodiment

Figure 13:
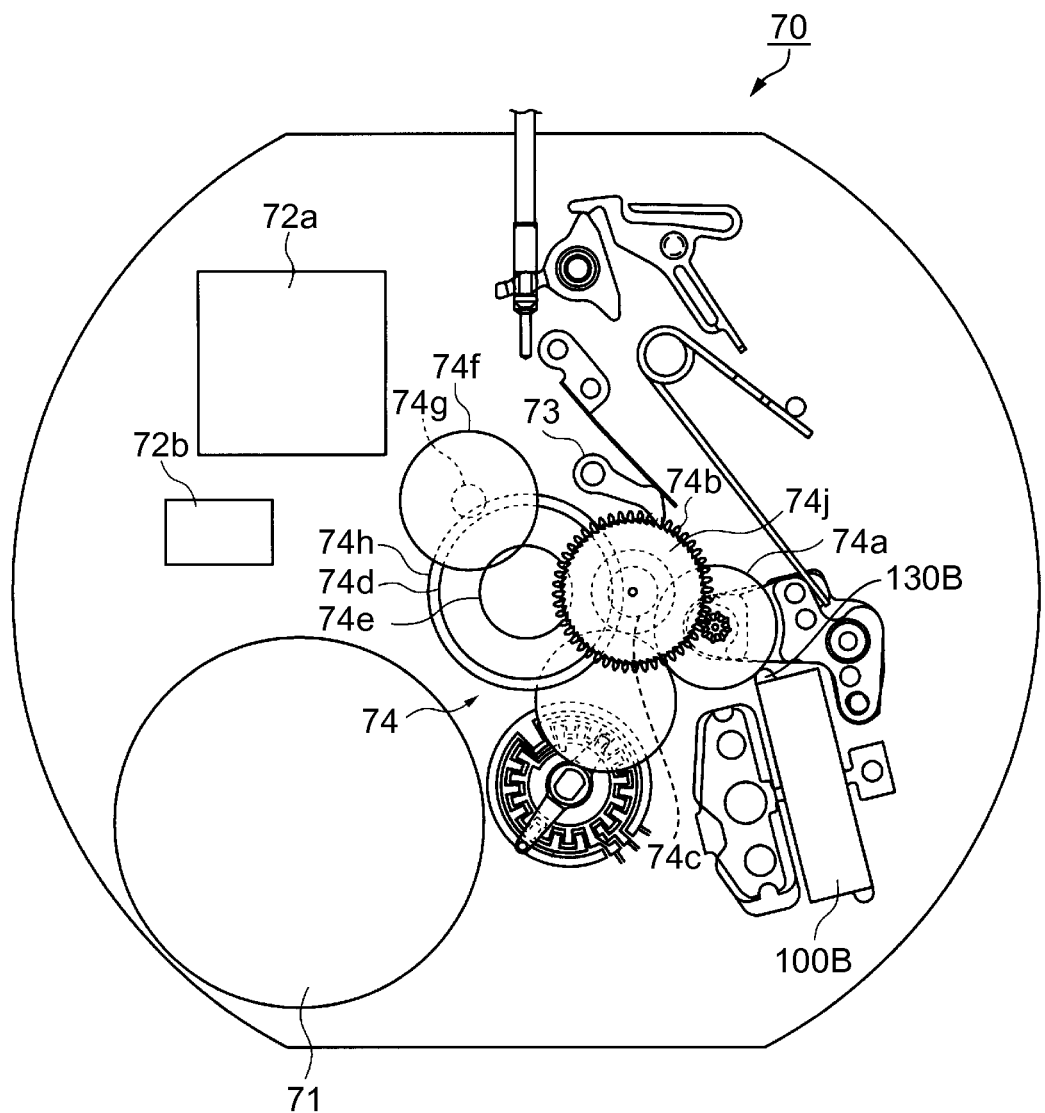
FIG. 13 is a plan view illustrating a train configuration of an electronic timepiece of a seventh embodiment.
Figure 14:
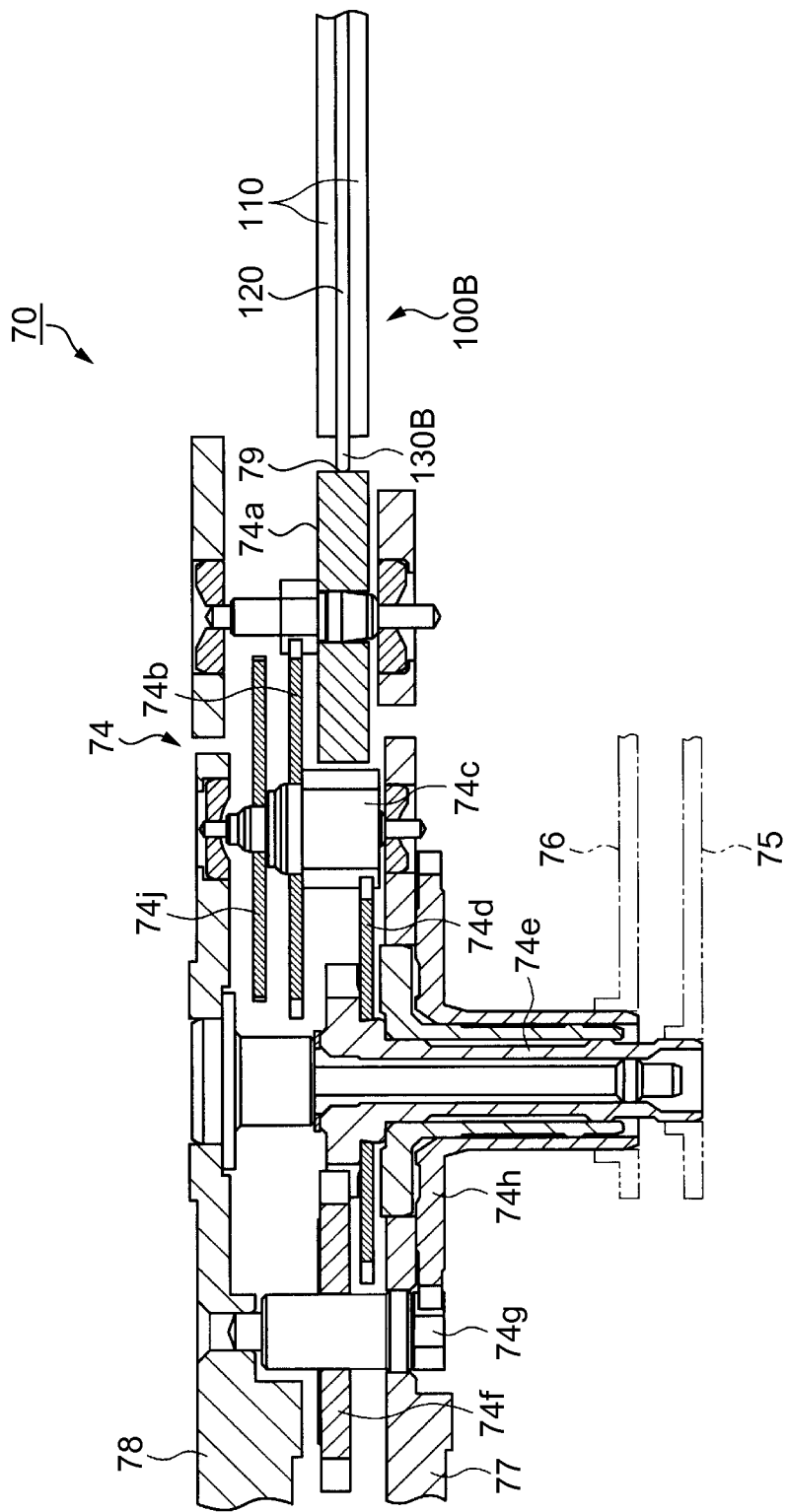
FIG. 14 is a cross-sectional view illustrating a train configuration of the electronic timepiece.

Subsequently, an electronic timepiece including the mechanism of the piezoelectric motor 1, that is, the piezoelectric elements 110, the oscillating plate 120, the driving projection, and the driven member driven by the driving projection will be described. FIG. 13 is a plan view illustrating a train configuration of the electric timepiece according to a seventh embodiment, and FIG. 14 is a cross-sectional view illustrating the train configuration of the electronic timepiece. FIG. 13 is a drawing of an electronic timepiece 70 viewed from the side opposite from the side indicating time-of-day and, in FIG. 13, the upper direction corresponds to the direction of 3 o'clock, the lower direction corresponds to the direction of 9 o'clock, the rightward direction corresponds to the direction of 12 o'clock, and the leftward direction corresponds to the direction of 6 o'clock of the electronic timepiece 70. In FIG. 14, the side indicating time-of-day of the electronic timepiece 70 corresponds to the lower side, and the side of a back lid corresponds to the upper side.

As illustrated in FIG. 13 and FIG. 14, the electronic timepiece 70 includes a train 74 configured to drive hands (minute hand 75 and hour hand 76) indicating time-of-day, an piezoelectric actuator 100B configured to drive the train 74, a cell 71, a control circuit portion 72a, and a crystal chip 72b. The cell 71, the control circuit portion 72a, and the crystal chip 72b are provided on a circuit board, not illustrated.

The train 74 includes a rotor (driven member) 74a driven by the piezoelectric actuator 100B, a gear 74b engaging the rotor 74a, and a center wheel & pinion 74d engaging a pinion 74c of the gear 74b. A cannon pinion 74e is mounted on the center wheel & pinion 74d, and the minute hand 75 is mounted on the cannon pinion 74e. A minute-wheel 74f engages the cannon pinion 74e of the center wheel & pinion 74d, and an hour-wheel 74h engages a pinion 74g of the minute-wheel 74f. The hour hand 76 is mounted on the hour-wheel 74h. The respective gears are supported by a bottom plate 77 and a train receiver 78 about shafts. When a second hand is to be further provided, a third wheel & pinion and a second wheel & pinion are provided to multiply the rotation of the center wheel & pinion 74d, and a second pinion configured to rotate integrally with the second wheel & pinion is arranged in the cannon pinion 74e, and the second hand is mounted.

Such an electronic timepiece 70 is configured in such a manner that when the piezoelectric actuator 100B is driven, a driving projection 130B provided at the corner side of the end of the oscillating plate 120 is in abutment with the rotor 74a with an inclination of a predetermined angle, so that the rotor 74a rotates counterclockwise in FIG. 13. Then, in association with the rotation of the rotor 74a, the gear 74b rotates clockwise, and at a timing when the gear 74b rotates until a claw lever 73 engaging the gear 74b engages a next tooth of the gear 74b (ratchet gear), the piezoelectric actuator 100B stops driving. By the rotation until the piezoelectric actuator 100B stops, the minute hand 75 and the hour hand 76 rotate. Specifically, the gear 74b rotates by an amount of 360/60=6 degrees. Then, when the gear 74b rotates by 6 degrees, the center wheel & pinion 74d rotates by 2 degrees, and the minute hand 75 rotates 2 degrees. Since the piezoelectric actuator 100B is driven at 20 seconds intervals, the minute hand 75 rotates by 2 degrees at 20 seconds intervals, and hence rotates by 6 degrees which corresponds to one graduation in one minute.

In the electronic timepiece 70 configured as described thus far, the driving projection 130B of the piezoelectric actuator 100B is formed of aluminum oxide, and the Young's modulus E1 thereof and the Young's modulus E2 of the aluminum oxide which forms the rotor 74a as the driven member are set to have a relationship of E1<E2. In this setting, the rotor 74a is subject to abrasion in comparison with the driving projection 130B in the sliding motion between the driving projection 130B and the rotor 74a, so that the abrasion resistance of the driving projection 130B is relatively improved. Therefore, in this configuration, the rotor 74a is replaced at the time of maintenance or the like in accordance with the extent of abrasion. In this manner, the electronic timepiece 70 includes the driving projection 130B having optimal abrasion resistance in accordance with the required function as a timepiece apparatus and the rotor 74a as the driven member, so that accurate time-of-day indication for a long time is enabled.

Although the piezoelectric actuator 100B is used for driving the hands of the electronic timepiece 70 here, the invention is not limited thereto, and may be used for driving a calendar mechanism such as a date indicator of the electronic timepiece 70. In this configuration, by replacing a stepping motor normally driving the date indicator with the piezoelectric actuator, further reduction in thickness of the electronic timepiece 70 may be realized, and simultaneously, since the piezoelectric actuator is insusceptible to the magnetism in comparison with the stepping motor, higher antimagnetic properties of the electronic timepiece 70 is also achieved. The piezoelectric motor 1 described above is not limited to the modes described in the respective embodiments, and effects similar to those in the embodiments are achieved in modes of modifications described below.

Modification 1

Although aluminum oxide is used for the driving projection 130 and the driven member 3 of the piezoelectric motor 1, the invention is not limited thereto, and zirconium oxide (ZrO), silicon carbide (SiC), titanium nitride (TiN) may also be used. The driving projection 130 and the driven member 3 are not limited to be formed of the same material (aluminum oxide), and may be formed of different materials as long as conditions relating to Young's modulus are satisfied. Accordingly, choice of the material is increased, and hence materials optimal for the shapes or the like of the driving projection 130 and the driven member 3 may be selected.

Modification 2

The driving projections 130, 130A, and 130B of the piezoelectric actuators 100, 100A, and 100B are provided as separate units on the oscillating plate 120. However, the form integrated with the oscillating plate 120 is also applicable.

Modification 3

Figure 15A:
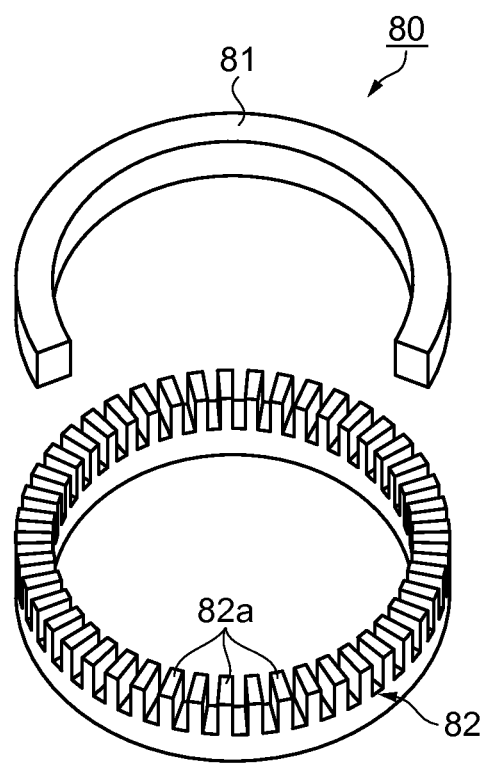
FIG. 15A is a perspective view illustrating a configuration of a traveling-wave-type ultrasonic motor as a modification.
Figure 15B:
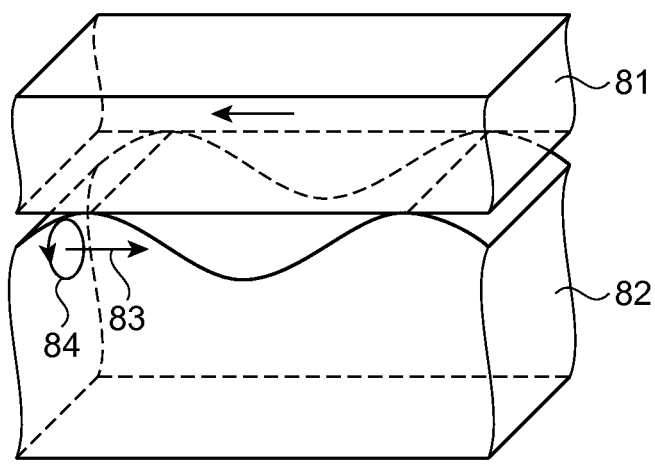
FIG. 15B is a schematic drawing illustrating an operation principle of the traveling-wave-type ultrasonic motor.

Examples of the piezoelectric motor 1 provided with the piezoelectric elements 110, the oscillating plate 120, and the driving projection 130 and the driven member 3 configured to be driven by the driving projection include a traveling-wave-type ultrasonic motor or the like. FIG. 15A is a perspective view illustrating a configuration of the traveling-wave-type ultrasonic motor as a modification, and FIG. 15B is a schematic drawing illustrating an operating principle of the traveling-wave-type ultrasonic motor. A traveling-wave-type ultrasonic motor 80 is used for driving an auto focus lens of a single-lens reflex camera, and includes a ring-shaped rotor 81 corresponding to the driven member, and a stator 82 corresponding to the piezoelectric element, the oscillating plate, and the driving projection and having comb-shaped projection on one side having a ring shape. The stator 82 is formed by bonding a piezoelectric element formed of piezoelectric ceramics on a ring-shaped metal. When a high-frequency voltage is applied to the stator 82, the stator resonates at a predetermined frequency and generates flexural oscillation 84 at a distal end portion of the comb-shaped projection as illustrated in FIG. 15B. Accordingly, a traveling wave 83 is generated in the stator 82. Consequently, the rotor 81 pressurized and held by the stator 82 is rotated by a friction between the rotor 81 and the stator 82.

The traveling-wave-type ultrasonic motor 80 in this configuration needs to provide a pressure to the rotor 81 in order to transmit the traveling wave 83 of the stator 82 to the rotor 81, and the accuracy of the contact surface needs to be enhanced. There is also a problem that the traveling wave 83 of the stator 82 cannot be transmitted well and the rotor 81 is subject to a friction, so that friction heat is increased. Therefore, referring to the piezoelectric motor 1 of the embodiment of the invention, the relationship between the Young's modulus E1 of the piezoelectric ceramics of the stator 82 and the Young's modulus E2 of the rotor 81 is set to E1≠E2, and also to be E1<E2, or E1>E2 depending on the object of usage. Accordingly, the problem as described above of the traveling-wave-type ultrasonic motor 80 is solved and reduction in size and improvement in durability are enabled. The setting of Young's modulus as described above may be applied to the shaft and bearing in addition to the traveling-wave-type ultrasonic motor 80.

The entire disclosure of Japanese Patent Application No. 2011-266547, filed Dec. 6, 2011 is expressly incorporated by reference herein.

What is claimed is:

1. A piezoelectric motor comprising:
an oscillating portion including a piezoelectric element and configured to oscillate;
a driving projection provided on the oscillating portion and projecting from the oscillating portion; and
a driven member with which the driving projection comes into abutment, wherein
Young's modulus E1 of the driving projection and Young's modulus E2 of the driven member have a relationship of E1≠E2.

2. The piezoelectric motor according to claim 1, wherein the Young's modulus E1 of the driving projection and the Young's modulus E2 of the driven member have a relationship of E1<E2.

3. The piezoelectric motor according to claim 1, wherein the driving projection and the driven member are formed of the same component but sintered at different temperatures.

4. The piezoelectric motor according to claim 1, wherein the driving projection and the driven member are formed of materials different in Young's modulus.

5. The piezoelectric motor according to claim 1, wherein the driving projection and the driven member includes magnesium oxide (MgO) and aluminum oxide ($Al_2O_3$), and at least areas from surface portions thereof coming into abutment with each other until a depth of 200 nm have the Young's modulus E1 or the Young's modulus E2.

6. A piezoelectric motor comprising:
an oscillating portion including a piezoelectric element and configured to oscillate;
a driving projection provided on the oscillating portion and projecting from the oscillating portion;
a driven member with which the driving projection comes into abutment, wherein
Young's modulus E1 of the driving projection and Young's modulus E2 of the driven member have a relationship of E1≠E2.

7. The motor according to claim 6, wherein the Young's modulus E1 of the driving projection and the Young's modulus E2 of the driven member have a relationship of E1>E2.

8. The piezoelectric motor according to claim 6, wherein the driving projection and the driven member are formed of the same component but sintered at different temperatures.

9. The piezoelectric motor according to claim 6, wherein the driving projection and the driven member are formed of materials different in Young's modulus.

10. The piezoelectric motor according to claim 6, wherein the driving projection and the driven member include magnesium oxide (MgO) and aluminum oxide ($Al_2O_3$), and at least areas from surface portions thereof coming into abutment with each other until a depth of 200 nm have the Young's modulus E1 or the Young's modulus E2.

* * * * *